(12) United States Patent
Files et al.

(10) Patent No.: US 12,189,370 B2
(45) Date of Patent: Jan. 7, 2025

(54) INFORMATION HANDLING SYSTEM DISPLAY BACKPLANE VAPOR CHAMBER

(71) Applicant: Dell Products L.P., Round Rock, TX (US)

(72) Inventors: Jace W. Files, Round Rock, TX (US); John Trevor Morrison, Round Rock, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 491 days.

(21) Appl. No.: 17/549,702

(22) Filed: Dec. 13, 2021

(65) Prior Publication Data

US 2023/0185286 A1 Jun. 15, 2023

(51) Int. Cl.
*G05B 19/418* (2006.01)
*H01L 21/67* (2006.01)

(52) U.S. Cl.
CPC .. *G05B 19/41805* (2013.01); *H01L 21/67253* (2013.01); *G05B 2219/45026* (2013.01)

(58) Field of Classification Search
CPC .... G05B 19/41805; G05B 2219/45026; H01L 21/67253
See application file for complete search history.

(56) References Cited

U.S. PATENT DOCUMENTS

| | | | |
|---|---|---|---|
| 5,579,528 A | 11/1996 | Register | |
| 5,966,284 A | 10/1999 | Youn et al. | |
| 6,243,261 B1 | 6/2001 | Janik et al. | |
| 6,421,237 B1 | 7/2002 | Kim | |
| 6,952,767 B1 | 10/2005 | Tanaka | |
| 6,954,357 B2 | 10/2005 | Tseng et al. | |
| 7,010,634 B2 | 3/2006 | Silvester | |
| 7,256,642 B2 | 8/2007 | Kimura | |
| 7,446,432 B2 | 11/2008 | Cha | |
| 7,957,012 B2 | 6/2011 | Silverbrook et al. | |
| 8,422,212 B2 | 4/2013 | Liu et al. | |
| 8,634,873 B2 | 1/2014 | Jones et al. | |
| 8,837,142 B2 | 9/2014 | McEwan et al. | |
| 8,917,501 B2 | 12/2014 | Hokugou et al. | |
| 9,215,813 B2 | 12/2015 | Brosseau et al. | |
| 9,274,565 B2 | 3/2016 | Tanaka | |
| 9,335,799 B2 | 5/2016 | Nguyen et al. | |
| 9,494,976 B2 | 11/2016 | Bates et al. | |

(Continued)

FOREIGN PATENT DOCUMENTS

| | | |
|---|---|---|
| CN | 206411622 | 8/2017 |
| CN | 107329862 | 11/2017 |

(Continued)

*Primary Examiner* — Gary Collins

(74) *Attorney, Agent, or Firm* — Zagorin Cave LLP; Robert W. Holland

(57) ABSTRACT

A portable information handling system modular hybrid architecture separates components between rotationally coupled housing portions to minimize cabling, connectors and materials, and to provide improved durability that supports recycling and reuse of the components. A display coupled in one housing portion integrates a vapor chamber in the display backplate that aligns with a main board central processing unit to dissipate thermal energy to the backplate and through the backplate to the housing.

18 Claims, 35 Drawing Sheets

(56) References Cited

U.S. PATENT DOCUMENTS

| | | |
|---|---|---|
| 9,507,385 B2 | 11/2016 | Chen et al. |
| 9,829,932 B2 | 11/2017 | Degner et al. |
| 9,857,848 B2 | 1/2018 | Liang |
| 9,946,981 B2 | 4/2018 | Gatson et al. |
| 10,006,967 B2 | 6/2018 | Ganesan et al. |
| 10,008,886 B2 | 6/2018 | Leabman |
| 10,255,881 B1 | 4/2019 | Patel |
| 10,401,926 B1 * | 9/2019 | North ................... G06F 1/1618 |
| 10,726,454 B2 | 7/2020 | Edmondson et al. |
| 10,811,201 B1 | 10/2020 | Files et al. |
| 10,955,878 B2 | 3/2021 | Wang et al. |
| 11,099,605 B2 | 8/2021 | Knoppert |
| 11,165,265 B2 | 11/2021 | Kristjansson et al. |
| 11,226,374 B2 | 1/2022 | Severson et al. |
| 11,243,576 B2 | 2/2022 | Gerardi |
| 11,360,153 B1 | 6/2022 | Wang |
| 11,579,663 B1 | 2/2023 | Files et al. |
| 11,740,707 B1 | 8/2023 | Files et al. |
| 2002/0048975 A1 | 4/2002 | Horikoshi et al. |
| 2002/0085343 A1 | 7/2002 | Wu et al. |
| 2004/0012509 A1 | 1/2004 | Chen |
| 2004/0190239 A1 | 9/2004 | Weng et al. |
| 2005/0174094 A1 | 8/2005 | Purdy et al. |
| 2006/0167656 A1 | 7/2006 | Shimonishi |
| 2007/0120525 A1 | 5/2007 | Tsuji |
| 2008/0174951 A1 | 7/2008 | Mundt et al. |
| 2008/0315788 A1 | 12/2008 | Levey |
| 2009/0168336 A1 | 7/2009 | Yokote et al. |
| 2009/0299881 A1 | 12/2009 | Del Rosario |
| 2009/0321511 A1 | 12/2009 | Browne |
| 2010/0149741 A1 | 6/2010 | Liu |
| 2011/0086611 A1 | 4/2011 | Klein |
| 2013/0088825 A1 | 4/2013 | Mizoguchi et al. |
| 2013/0222993 A1 | 8/2013 | Izuka |
| 2013/0286561 A1 | 10/2013 | Hokugou et al. |
| 2013/0308261 A1 | 11/2013 | Matsumoto et al. |
| 2014/0108846 A1 | 4/2014 | Berke et al. |
| 2014/0172478 A1 | 6/2014 | Vadasz |
| 2014/0204519 A1 | 7/2014 | Wu |
| 2014/0204520 A1 | 7/2014 | Wu et al. |
| 2014/0355193 A1 | 12/2014 | Purcocks |
| 2015/0035370 A1 | 2/2015 | Wyatt et al. |
| 2015/0189962 A1 | 7/2015 | Yeo et al. |
| 2015/0317951 A1 | 11/2015 | Genoe |
| 2015/0346784 A1 * | 12/2015 | Delano ................... G06F 1/203 |
| | | 361/679.53 |
| 2016/0011627 A1 | 1/2016 | Lin |
| 2016/0149597 A1 | 5/2016 | Takasu |
| 2016/0231788 A1 | 8/2016 | Chen et al. |
| 2017/0004421 A1 | 1/2017 | Gatson |
| 2017/0110268 A1 | 4/2017 | Tachikawa |
| 2017/0124110 A1 | 5/2017 | Hajj |
| 2017/0242290 A1 * | 8/2017 | Jenkins ................ G02B 6/0036 |
| 2017/0370135 A1 | 12/2017 | Wang |
| 2018/0060133 A1 | 3/2018 | Fang et al. |
| 2019/0044436 A1 | 2/2019 | Hijazi et al. |
| 2019/0050869 A1 | 2/2019 | Lau |
| 2019/0080670 A1 | 3/2019 | Jung |
| 2019/0196011 A1 | 6/2019 | Brodsky et al. |
| 2019/0196551 A1 | 6/2019 | Wang et al. |
| 2019/0204392 A1 | 7/2019 | Bertness |
| 2019/0302852 A1 | 10/2019 | Kitamura et al. |
| 2020/0133818 A1 | 4/2020 | Katami |
| 2020/0333852 A1 | 10/2020 | Smith et al. |
| 2020/0348745 A1 | 11/2020 | Hamlin et al. |
| 2021/0006079 A1 | 1/2021 | Weiderstrand |
| 2021/0110366 A1 | 4/2021 | Dion et al. |
| 2021/0133007 A1 | 5/2021 | Ghosh |
| 2021/0160355 A1 | 5/2021 | Min et al. |
| 2021/0173456 A1 * | 6/2021 | Kulkarni ............ H05K 7/20163 |
| 2021/0223825 A1 | 7/2021 | Seiler et al. |
| 2022/0045372 A1 | 2/2022 | Junger et al. |
| 2022/0167187 A1 | 5/2022 | Jia |
| 2022/0289067 A1 | 9/2022 | Adegbohun |
| 2023/0185277 A1 | 6/2023 | Morrison et al. |
| 2023/0185285 A1 | 6/2023 | Morrison et al. |
| 2023/0185286 A1 | 6/2023 | Files et al. |
| 2023/0185291 A1 | 6/2023 | Morrison et al. |
| 2023/0185331 A1 | 6/2023 | Files et al. |
| 2023/0185332 A1 | 6/2023 | Morrison et al. |
| 2023/0185343 A1 | 6/2023 | Morrison et al. |
| 2023/0185348 A1 | 6/2023 | Morrison et al. |
| 2023/0185354 A1 | 6/2023 | Files et al. |
| 2023/0185690 A1 | 6/2023 | Morrison et al. |
| 2023/0186802 A1 | 6/2023 | Morrison et al. |
| 2024/0094781 A1 | 3/2024 | Patel |

FOREIGN PATENT DOCUMENTS

| | | |
|---|---|---|
| CN | 207067863 | 3/2018 |
| CN | 113776805 | 12/2021 |
| CN | 114112137 | 3/2022 |
| DE | 102005042538 | 4/2006 |
| JP | 2000194586 | 7/2000 |
| JP | 2003074536 | 3/2003 |
| JP | 2010045750 | 2/2010 |
| WO | WO2019059274 | 3/2019 |

* cited by examiner

| | CURRENT DESIGN | INTEGRATED DESIGN |
|---|---|---|
| A COVER (LOCALIZED) | 0.6 | 0.6 |
| GRAPHITE SHEET | 0.1 | 0.1 |
| AIRGAP | 0.4 | 0.4 |
| PCB | 0.6 | 0.6 |
| CPU | 1.033 | 1.033 |
| THERMAL BLOCK | 0.4 | 0.4 |
| VC | 0.7 | 0.4 |
| AIRGAP | 0.4 | |
| GRAPHITE SHEET | 0.1 | |
| LCD PANEL | 2.45 | 2.45 |
| TOTAL | 6.78 | 5.98 |

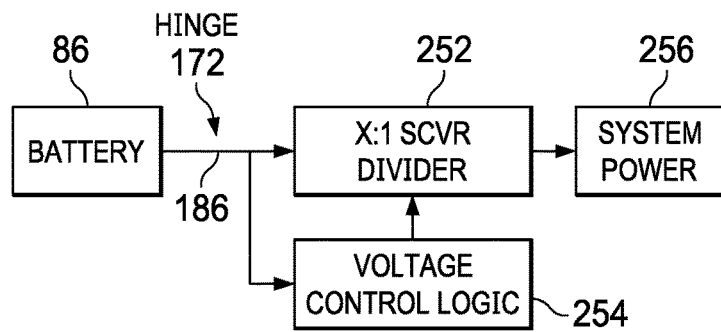
FIG. 16
| 12S BATTERY V | DIVIDER X:1 | | | |
|---|---|---|---|---|
| | 7 | 6 | 5 | 4 |
| 51.6 | 7.4 | 8.6 | 10.3 | 12.9 |
| 48 | 6.9 | 8.0 | 9.6 | 12.0 |
| 44.4 | 6.3 | 7.4 | 8.9 | 11.1 |
| 39.6 | 5.7 | 6.6 | 7.9 | 9.9 |
| 36 | 5.1 | 6.0 | 7.2 | 9.0 |
FIG. 17
FIG. 18
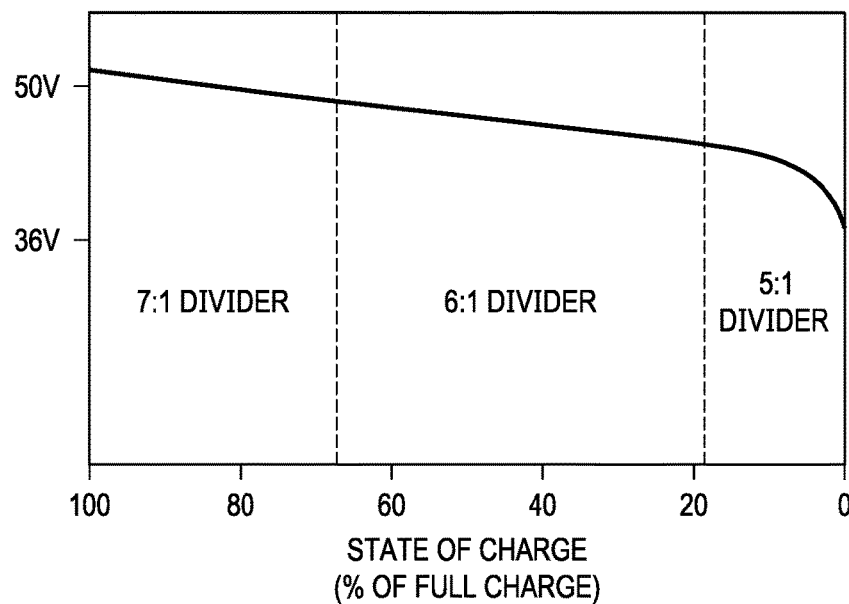

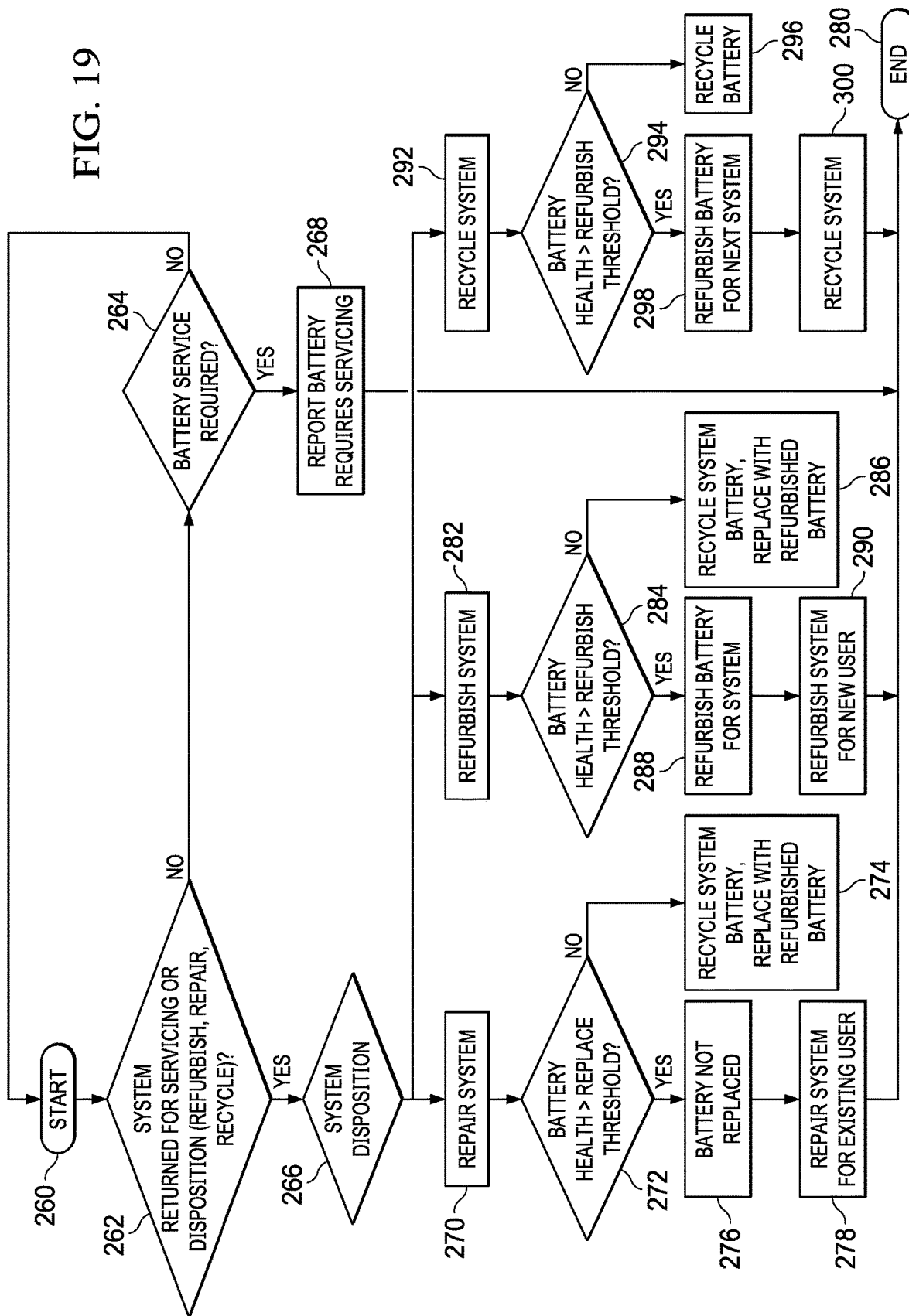

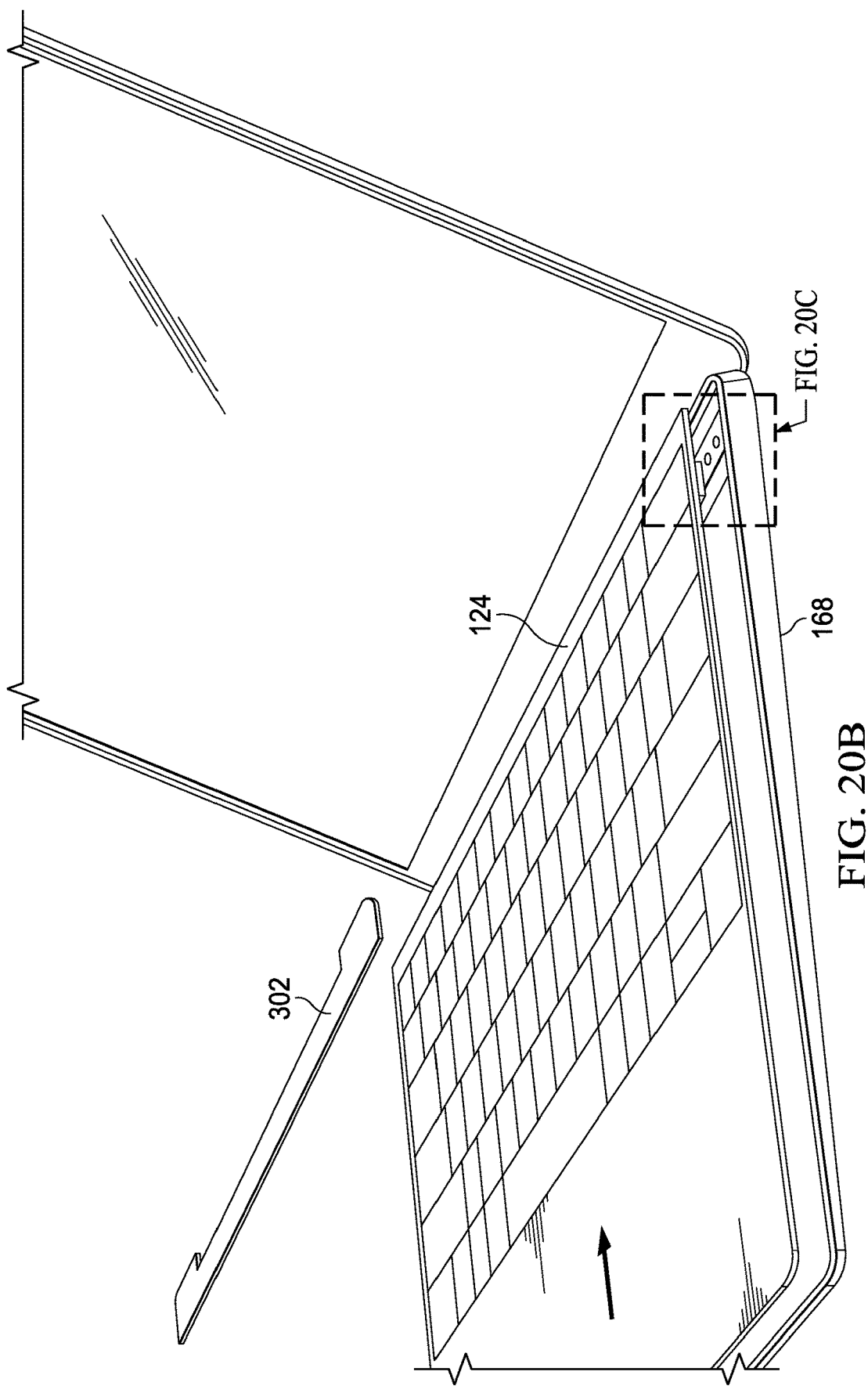

CLAMSHELL TORQUE DEGRADATION DATA

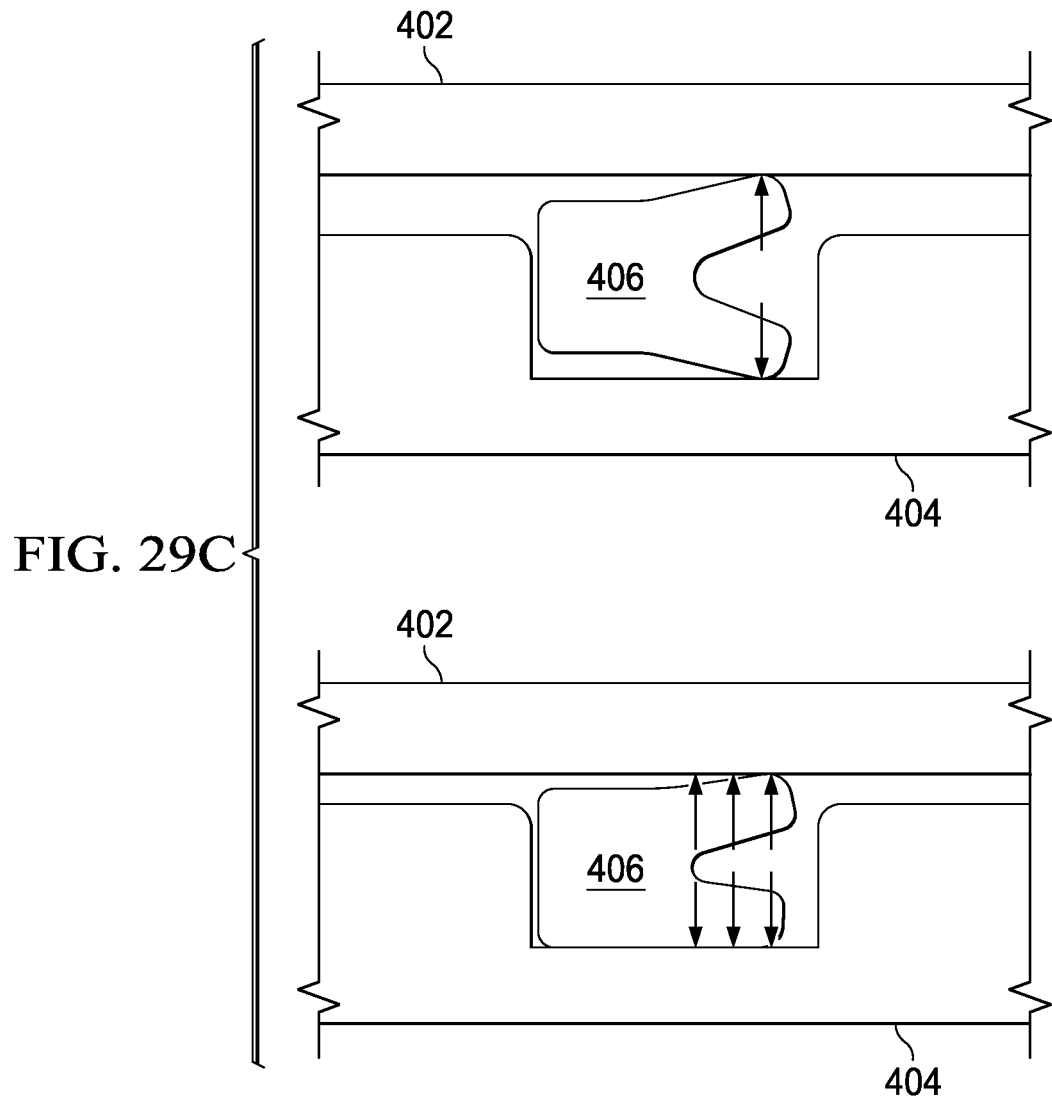

INFORMATION HANDLING SYSTEM DISPLAY BACKPLANE VAPOR CHAMBER

CROSS-REFERENCE TO RELATED APPLICATION(S)

This application is related to the application entitled "Information Handling System Disposition Automated Using System Metrics," naming John Trevor Morrison, Jace W. Files, and Andrew P. Tosh as inventors, filed Dec. 13, 2021, application Ser. No. 17/549,688, which application is incorporated herein by reference.

This application is related to the application entitled "Modular Information Handling System with Automated Housing Cover Removal," naming Jace W. Files, John Trevor Morrison, and Andrew P. Tosh as inventors, filed Dec. 13, 2021, application Ser. No. 17/549,678, which application is incorporated herein by reference.

This application is related to the application entitled "Modular Information Handling System with Automated Display Removal," naming Jace W. Files, John Trevor Morrison, and Andrew P. Tosh as inventors, filed Dec. 13, 2021, application Ser. No. 17/549,681, which application is incorporated herein by reference.

This application is related to the application entitled "Information Handling System Main Board Disposition Automated Using Performance Metrics," naming John Trevor Morrison, Jace W. Files, and Andrew P. Tosh as inventors, filed Dec. 13, 2021, application Ser. No. 17/549,683, which application is incorporated herein by reference.

This application is related to the application entitled "Modular Information Handling System High Voltage Main Board Power Supply," naming Jace W. Files, John Trevor Morrison, and Andrew P. Tosh as inventors, filed Dec. 13, 2021, application Ser. No. 17/549,689, which application is incorporated herein by reference.

This application is related to the application entitled "Modular Information Handling System and Subscription Deployment Thereof," naming Jace W. Files, John Trevor Morrison, and Andrew P. Tosh as inventors, filed Dec. 13, 2021, application Ser. No. 17/549,691, which application is incorporated herein by reference.

This application is related to the application entitled "Modular Information Handling System Component Connections," naming John Trevor Morrison, Jace W. Files, and Michiel Sebastiaan Emanuel Petrus Knoppert as inventors, filed Dec. 13, 2021, application Ser. No. 17/549,696, which application is incorporated herein by reference.

This application is related to the application entitled "Information Handling System Battery Disposition Automated Using Performance Metrics," naming John Trevor Morrison, Jace W. Files, and Michiel Sebastiaan Emanuel Petrus Knoppert as inventors, filed Dec. 13, 2021, application Ser. No. 17/549,698, which application is incorporated herein by reference.

BACKGROUND OF THE INVENTION

Field of the Invention

The present invention relates in general to the field of information handling systems, and more particularly to an information handling system display backplane vapor chamber.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system manufacture tends to involve a large number of different kinds of materials and industrial processes. A typical information handling system includes hundreds of electronic components that often include metals and materials that are manufactured with a substantial environmental impact. As an example, metals found in an information handling system include copper used in conductive wires, iron used in steel and stainless steel frames, aluminum used in housings and heat sinks, precious metals like silver and gold used as corrosive-resistant conductors, and rare earth metals used in magnetic components. Battery manufacture often involves the use of lithium, cobalt and nickel. Although manufacturers understand the environmental impact of using these materials, often no alternatives exist. To help reduce the environmental impact of information handling system manufacture and use, manufacturers attempt to encourage recycling of information handling systems after their useful life is complete. These efforts have had some success with major components, such as batteries, however, smaller components are difficult to recycle in an efficient manner.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Portable information handling systems tend to present significant difficulties with respect to recycling and reuse of components. End user's prefer to have portable information handling systems that are light weight and compact so that mobile use is convenient. The drive towards minimal weight and thickness often results in designs of internal components to have minimal footprint so that disassembly of the system at recycling tends to be difficult and time consuming. To make effective use of available housing space the designs will often involve specialized components that are difficult to reuse and recycle, such as motherboards and thermal management systems configured to fit into specific portions of a portable housing. In addition, portable information handling systems have a wide variety of usage models that have different impacts on system life and reliability. For instance, some users who travel often tend to operate their systems on batteries and to rely on integrated input/output devices, such as keyboards and displays. Travel tends to subject information handling systems to greater risk of damage from contaminants that have a less predictable impact on system life. In contrast, other users who travel less may dock their portable information handling systems and rely on peripheral input devices and peripheral displays so that integrated input/output devices have relatively little use. These different usage models are difficult to consider at system design since each portable information handling system generally has to have components that are robust enough to handle worse case scenarios for a minimum lifespan.

SUMMARY OF THE INVENTION

Therefore, a need has arisen for a system and method which accelerates the circular economy for information handling systems by automating reuse, refurbishment and recycling of information handling system components.

In accordance with the present invention, a system and method are provided which substantially reduce the disadvantages and problems associated with previous methods and systems for reuse, refurbishment and recycling of information handling systems and their components. Information handling system reuse, refurbishment and recycling are automated with a modular component architecture that enhances efficiencies of tracking component useful life for improved distribution of information handling systems to a user population. Components are tracked during operation, tested at return from an end user and assigned for refurbishment in information handling systems to target the performance and useful life needs of end users.

More specifically, a modular component architecture is used to build information handling systems so that components are assembled and disassembled in an automated manner that encourages a circular economy. In the example embodiment, a portable information handling system is built in a portable housing around a main board that defines processing capability, such as with a central processing unit (CPU), memory (RAM) and graphics processing unit (GPU), and around a secondary board that defines support functions, such as power management, thermal management, input device management and external ports. The main board couples to snap coupling devices in a lid housing portion and the secondary board couples to snap coupling devices in a main housing portion so that assembly and disassembly can be automated with pressure applied to couple and release the boards. A display couples over the main board and integrates a vapor chamber that thermally interfaces with the CPU to distribute and reject excess thermal energy. The display interfaces with the main board by a contact interface, such as pogo pins and contact pads or connectors aligned at the side of the main board and a side of a timing controller board. A housing cover with an integrated keyboard and touchpad couples over the secondary board and interfaces through a contact interface, such as opposing pogo pins and contact pads, with an embedded controller to manage keyboard inputs. The main board and secondary boards interface with a single cable that passes through a hinge rotationally coupling the lid and main housing portions. Assembly and disassembly of the main and secondary boards in the housing with the display and housing cover coupled in place may be performed in a completely automated manner by locking the display and keyboard in place with a keystone element that couples to the housing.

Information handling system components are tracked as inventory based upon status of use, including new, in use, reused, refurbished and recycled. Operational systems have component useful life tracked based upon end user interactions. For example, display use, keyboard use, battery use, hinge use and other component use is monitored at each information handling system and reported to a subscription manager so that information handling systems distributed to operational users may be returned based upon component useful life remaining. At a return center the components are harvested with automated disassembly and binned for reuse based upon useable life remaining determined from tracking performed during operations and automated evaluations available for some components at the return center. For components that have useable life remaining, refurbishment in rebuilt information handling systems is guided by usage patterns of end users who will receive the refurbished systems. For example, batteries and integrated input devices having less useable life remaining may be directed towards users with usage patterns that indicate docked or less-mobile use. Similarly, main boards are directed to end users based upon detected performance metrics so that end users who receive a refurbished information handling system will have appropriate processing capabilities for the end user's subscription and expected use.

The present invention provides a number of important technical advantages. One example of an important technical advantage is that a modular information handling system design optimizes component reuse, refurbishment and recycling for a reduced carbon footprint associated with information handling system manufacture and use. The modular architecture and tracking of component use accelerates the circular economy, reduces emissions and makes recycling and reuse easier and automated while having minimal if any impact on end user experiences. Indeed, end users have information handling systems assigned to meet defined usage patterns and manufactured at a reduced cost.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 16 depicts a circuit block diagram of a system for transfer of power from a secondary board to a primary board across a hinge;

FIG. 17 depicts a table of divider ratios for use with a switched capacitor voltage regulator to manage high voltage transfer to a main board;

FIG. 18 depicts the divider ratios graphically for the battery native voltage over a battery discharge;

FIG. 19 depicts a flow diagram of a process for use of battery metrics to automate battery disposition of an information handling system;

FIGS. 20A, 20B, 20C and 20D depict an example embodiment of an information handling system having an automated and tool-less housing cover removal;

FIGS. 29A, 29B and 29C depict a speaker configuration for modular assembly in an information handling system.

DETAILED DESCRIPTION

Information handling system re-use, refurbishment and recycling promote full use of component life cycles for more efficient resource use and fulfillment of subscriber information processing needs. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
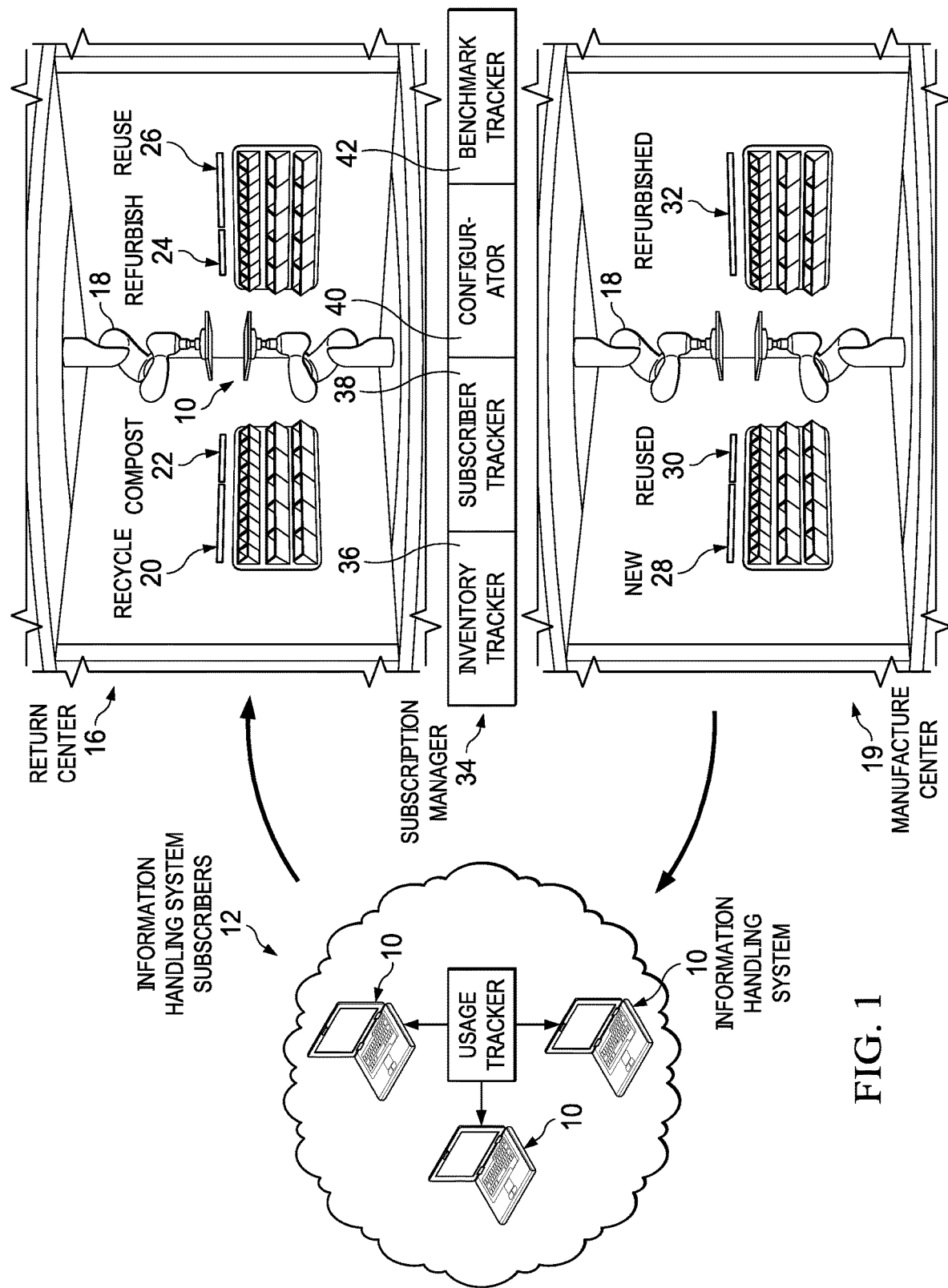
FIG. 1 depicts a block diagram of a system for managing information handling system manufacture with new, used, refurbished and recycled components to fulfill subscriber information processing needs.

Referring now to FIG. 1, a block diagram depicts a system for managing information handling system manufacture with new, used, refurbished and recycled components to fulfill subscriber information processing needs. Plural information handling systems 10 are distributed to plural subscribers of an information handling system subscriber population 12 with a usage tracker 14 that tracks use of the information handling systems 10 and their components to manage component re-use, refurbishment, and recycling through a return center 16 and manufacture center 18 as described in detail herein. Subscribers may include enterprises and individuals who receive information handling systems 10 on a subscription basis with a defined set of performance characteristics that are maintained over time by a manufacturer of information handling systems 10, such as with swaps of deployed information handling systems 10 by new or refurbished systems as needed to maintain the subscribed performance characteristics. A subscription can define the performance characteristics in component absolute performance terms, such as processing per second or memory capacity capability, component relative performance capability, such as in percentage terms of a maximum capability of available components, or task capability, such as the ability to perform office processing, computer assisted drawing, graphics presentation or similar tasks. Usage tracker 14 provides insight to component life remaining and subscriber-specific component wear so that components achieve a full economic life cycle while subscribers have information handling systems aligned to meet their processing needs. As is described in greater depth below, information handling systems 10 enhance circular use of components by functional group assembly with interchangeable structures so that automated tracking, breakdown, refurbishment and reassembly reduces costs and maintains subscribers at their agreed subscription performance.

The system provides a process to analyze an information handling system's components, and determine which components should be reused, refurbished or recycled. For instance, artificial intelligence interfaced with usage trackers 14 and receiving analysis of components in returned systems predicts component usable life remaining and the efficacy of redeployment of components by comparing performance metrics of the components against performance characteristics of subscribers. Deployed information handling systems in an operational environment become part of an inventory of components that artificial intelligence can efficiently redistribute so that all components wear through a usable life while offering a subscriber level of system reliability. As an initial matter, for each information handling system 10 components are tracked and parameters for each component are analyzed while in the operational field or upon return to return center 16 to determine if the component has reached an end of life and/or to determine the amount of life remaining for the components. Once each component's remaining useful life is predicted, a returned information handling system 10 is disassembled to a state that allows removal of worn components and replacement with updated components having performance metrics that will meet a set of one or more subscription performance characteristics. A refurbished information handling system is returned to an appropriate subscriber end user, such as one having performance characteristics that match the performance metrics of the system, and separated components are directed to a location for reuse, refurbishment or recycling. Based upon usage associated with different end users, particular systems with user-appropriate levels of usable life can be directed so that a system has a balanced component profile that uses all components available life in an efficient manner.

In the example embodiment, a return center 16 includes a robotic arm 18 that automatically identifies returned information handling systems 10, such as with an optical or wireless code, breaks the system down to defined components and places the defined components in appropriate inventory groups based upon performance metrics gleaned from usage information of usage tracker 14. For instance, based upon an amount of usage or tracked performance, components are sorted into a recycle group 20 that has reached their useful life but have valuable materials; a compost group 22 that does not have recyclable value, a refurbish group 24 that has remaining useful life with some cost effective refurbishment on the component; and a reuse group 26 that has operational useful life remaining with direct assembly to a rebuilt information handling system. The assignment of components to particular groups is supported with a subscription manager 34 that applies artificial intelligence to usage information communicated by usage trackers 14 through a network, such as the Internet to a cloud network location. Subscription manager 34 is for instance a distributed application with instructions stored in non-transitory memory and executed on network resources, such as server information handling systems.

An inventory tracker 36 executes instructions that track deployed components, such as those in operational use by information handling system subscribers 12, separated components, such as those separated from deployed information handling systems that were broken down by return center 16, and new components not yet used in an information handling system build. By treating deployed information handling systems as part of the component inventory, inventory tracker 36 aids in scheduling the distribution of replacement information handling system to the subscription population so that subscribed performance characteristics are maintained. For example, replacements for deployed information handling systems may be shipped in part so that predetermined components will be returned for reuse. For instance, an information handling system deployed to a subscriber may be used primarily in a docked configuration so that the integrated display and keyboard of the information handling system has minimal use while the end user relies heavily on a graphics processing unit to drive external displays. Sending a replacement system to harvest the keyboard and integrated display for use in a refurbished system helps to use the useful life of those components more effectively while the end user receives a replacement with enhanced graphics processing and an integrated display and keyboard having less useful life remaining. Further, treating deployed components as part of an active inventory helps to balance overall costs and system availability in the event of variance in the availability of components. As an example, flash storage of solid state drives may have wide variances in usage from subscriber to subscriber so that subscription system changes can achieve more effective distribution of flash memory life cycles and provide balance in information retrieval speeds based on end user usage patterns with respect to information storage and retrieval.

A subscriber tracker 38 receives subscriber information handling systems usage data from usage trackers 14 and applies component usage to define subscriber usage patterns that define how each subscriber wears components of the information handling system 10 used by the subscriber. Over time, performance metrics of information handling systems 10 and their components tend to decrease with wear and eventually fall below the performance characteristics assigned to the subscriber. Subscriber tracker 38 compares the performance metrics determined from usage information with assigned performance characteristics to ensure that the end user subscriber has an information handling system 10 with sufficient capabilities and to schedule a replacement information handling system for shipment to the subscriber so that a system with sufficient performance metrics will arrive and replace the subscriber's existing system before failure or substandard performance. In addition to managing hardware component life cycle and performance for subscribers, subscriber tracker 38 manages software configurations and data storage so that replacement information handling systems 10 arrive properly configured and ready to run the subscriber's applications with the subscriber's information. For instance, secure cloud storage of end user information is flashed to an SSD of a replacement information handling system along with all appropriate licenses, permissions and configurations so that the replacement information handling system powers up ready to run with minimal disruption to the end user.

A configurator 40 applies the inventory information and subscriber information to configure replacement information handling systems to replace deployed subscriber information handling systems 10 so that performance characteristics are maintained by component performance metrics. In the example embodiment, a manufacture center 19 interfaces with configurator 40 to build replacement information handling systems with new components 28, reused components 30 and refurbished components 32. An automated robotic arm 18 builds information handling systems from standardized components selected based upon the component performance metrics and to meet subscriber performance characteristics. In part, component selection is guided by results of a benchmark tracker 42 that tracks performance metrics by monitoring how components perform in operational conditions and after separation from a returned information handling system. For example, a main board having a central processing unit and memory is automatically interfaced with a tester to evaluate actual computational characteristics so that configurator 40 can select main boards to include in builds that align with subscriber performance characteristics. Configurator 40 selects new, reused and refurbished components to target not only subscriber performance characteristics, but also efficient use of a complete component life cycle.

Figure 2:
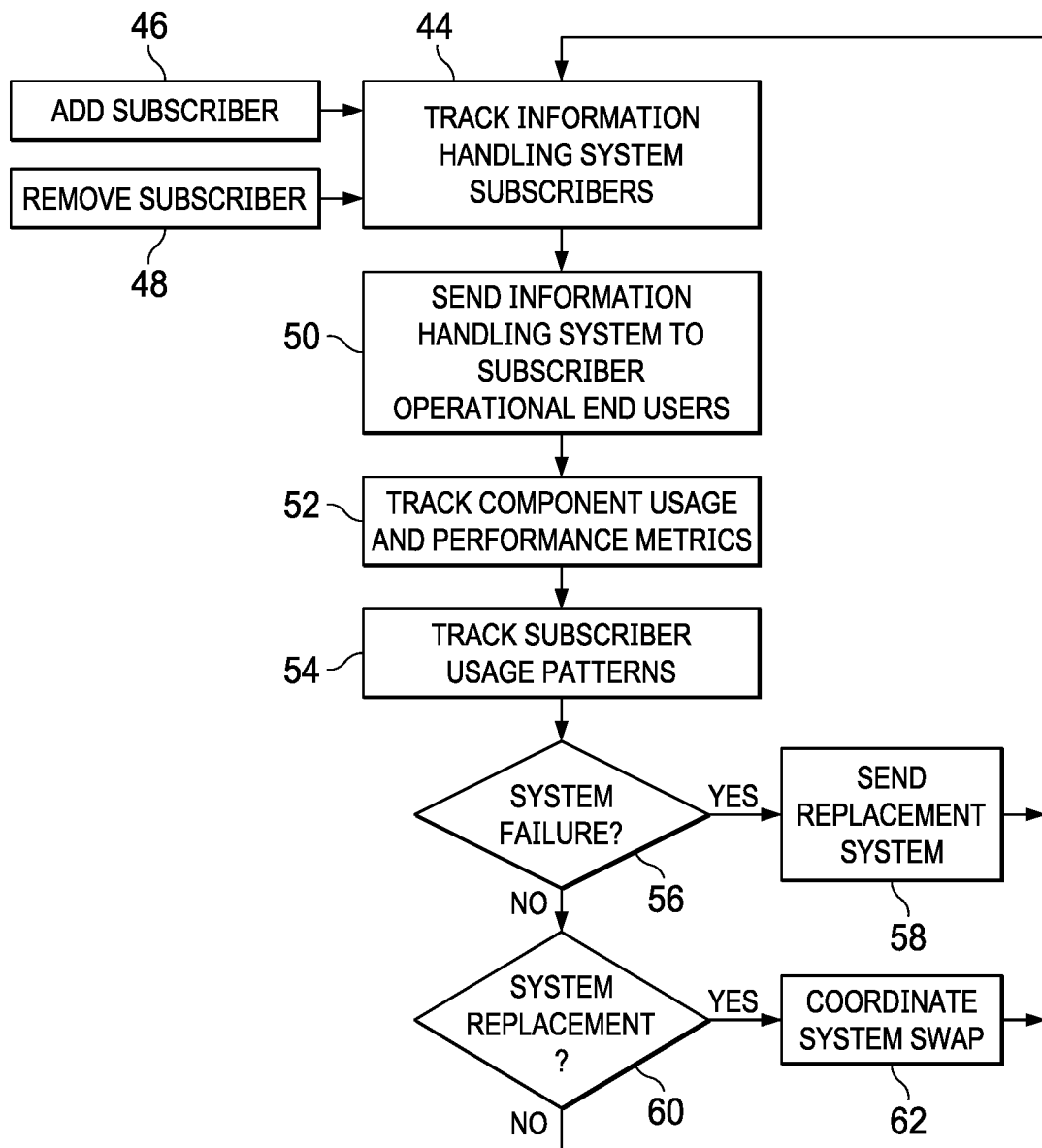
FIG. 2 depicts a flow diagram of a process for managing distribution of information handling systems having new, reused and refurbished components.

Referring now to FIG. 2, a flow diagram depicts a process for managing distribution of information handling systems having new, reused and refurbished components. The process starts at step 44 by tracking information handling system subscribers who have subscribed to have an information handling system provided of a defined set of one or more performance characteristics. Subscribers may be added at step 46 and removed at step 48 over time, and various levels of subscription levels may be provided, such as based on desired performance or enterprise groups of desired sizes, and changed over time. At step 50, information handling systems are operationally deployed to subscriber end users based upon the subscriber performance characteristics and the performance metrics of available components. At step 52, component usage and performance metrics are tracked at the information handling systems, such as with a usage tracker stored in non-transitory memory and executed on a processing resource, such as the central processing unit or a trusted processor module that maintains system specific usage in secure memory. The usage tracking focuses on component usage at an assembly module level with an emphasis on determining component useful life remaining. For instance, the components may be broken down into a defined set of categories that are separated out at a return center and used as a basis for building refurbished systems: a main board having main processing capabilities; a secondary board having support capabilities; a battery; audio-visual capabilities like speakers and cameras; an integrated display; an integrated keyboard and/or touchpad; and hinges. In alternative embodiments, alternative component breakdowns may be used, and more discrete usage tracking may be used to aid in selecting recycled discrete components to support more involved component rebuilding efforts.

At step 54, subscriber usage patterns are tracked to associate usage patterns with subscribers at a component category level. Subscriber usage pattern tracking helps to determine when a deployed information handling system will reach performance metrics or failure risk that is less than the subscribers assigned performance characteristics. In this manner, replacement information handling systems are distributed proactively to achieve subscriber end user expectations for performance and reliability. In addition, tracking subscriber usage patterns aids in distribution of information handling systems to subscribers with component useful life remaining aligned with subscriber usage patterns. Component selection is provided for the subscriber so that refurbished components with less useable life can be directed towards subscribers with usage patterns that do not rely on more worn components. Further, emphasizing component selection for subscribers that align with the subscriber usage helps to increase the subscriber experience while balancing system cost by leaning on refurbished components where less impactful. At step 56 a determination is made based upon the component usage and performance metrics plus the subscriber usage patterns of whether a system failure has occurred or imminently will occur. In such situations, the process continues to step 58 to send the replacement information handling system without delay. If a system failure has not occurred or is not a high current risk, the process continues to step 60 to determine if a system replacement should take place. For example, the decision to replace a deployed system may include a comparison of the subscriber performance characteristics and metrics, a comparison of component life remaining and subscriber usage patterns, and a comparison of components installed and life cycle remaining against a need for component inventory that becomes available at refurbishment of the information handling system. The system replacement determination is performed with analysis by artificial intelligence or other resources that define a cost effective and environmentally sensitive model. If a system replacement is determined, the process continues to step 62 to coordinate a system swap. If a system replacement is not determined, the process continues to step 44 to continue monitoring information handling system component and subscriber usage patterns.

Figure 3:
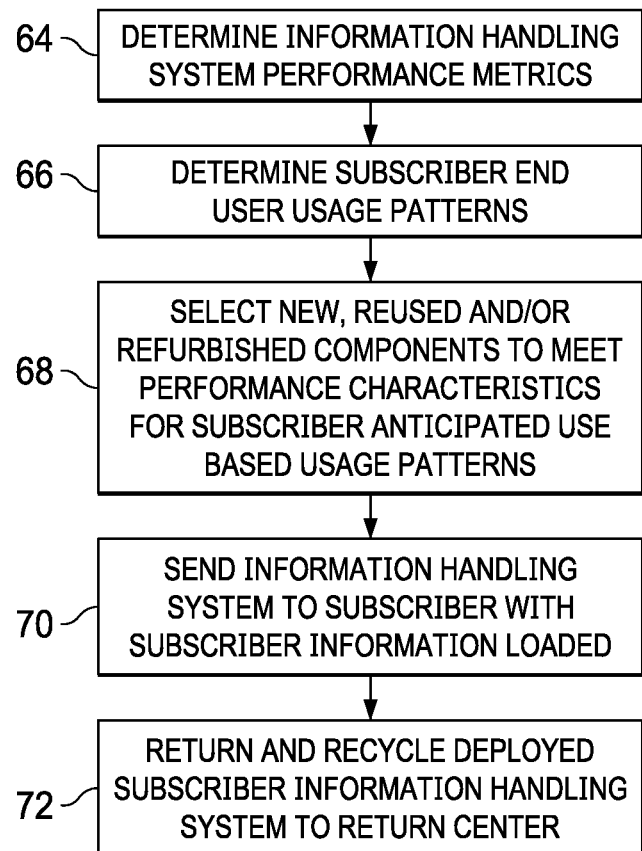
FIG. 3 depicts a flow diagram of a process for selecting information handling system components for reuse and refurbishment.

Referring now to FIG. 3, a flow diagram depicts a process for selecting information handling system components for reuse and refurbishment. The process starts at step 64 with determination of information handling system performance metrics at deployed information handling systems. Performance metrics are tracked during normal operations on a component-by-component basis and may also be tested by executing a performance metric application on the information handling system, such as calculating a predetermined processing or graphics load. At step 66 subscriber end user usage patterns are determined at deployed information handling systems, such as by monitoring the type and frequency of end user interactions at an information handling system. Indications of subscriber usage patterns may include interactions at integrated versus peripheral input/output devices, coupling to a docking station, operations on battery versus external power, accelerations that indicate portable versus stationary use, housing open versus closed positions and other usage variances that impact component wear. At step 68, new, reused and/or refurbished components are selected to meet performance characteristics of a subscriber anticipated to use a refurbished information handling system based upon the subscriber's usage patterns. The refurbishment process itself may optimize component allocation based upon remaining life and anticipated subscriber usage by minimizing the component swap in the refurbishment process. For instance, a subscriber who uses the system docked and a subscriber who relies upon mobile battery operations with integrated devices might simply swap the batteries and keyboards of the two systems and so that the mobile user has a fresh battery and keyboard while the docked user has a keyboard and battery with less useful life that matches the subscriber's usage pattern or relying on peripheral devices through the dock. At step 70, the refurbished information handling system is sent to the subscriber with the subscriber's configuration and information loaded. At step 72, the returned information handling systems from the subscriber has components reused, refurbished and recycled at a return center. Although the example described above addresses a small sample of systems and components, with a larger subscriber base even small or incremental increases in the use of a component through its useful life will reduce costs, improve the circular economy and encourage recycling. In a broader sense, by tracking power use of older components compared with newer and improved components, a reduction in energy use and carbon emissions is also achieved.

Figure 4:
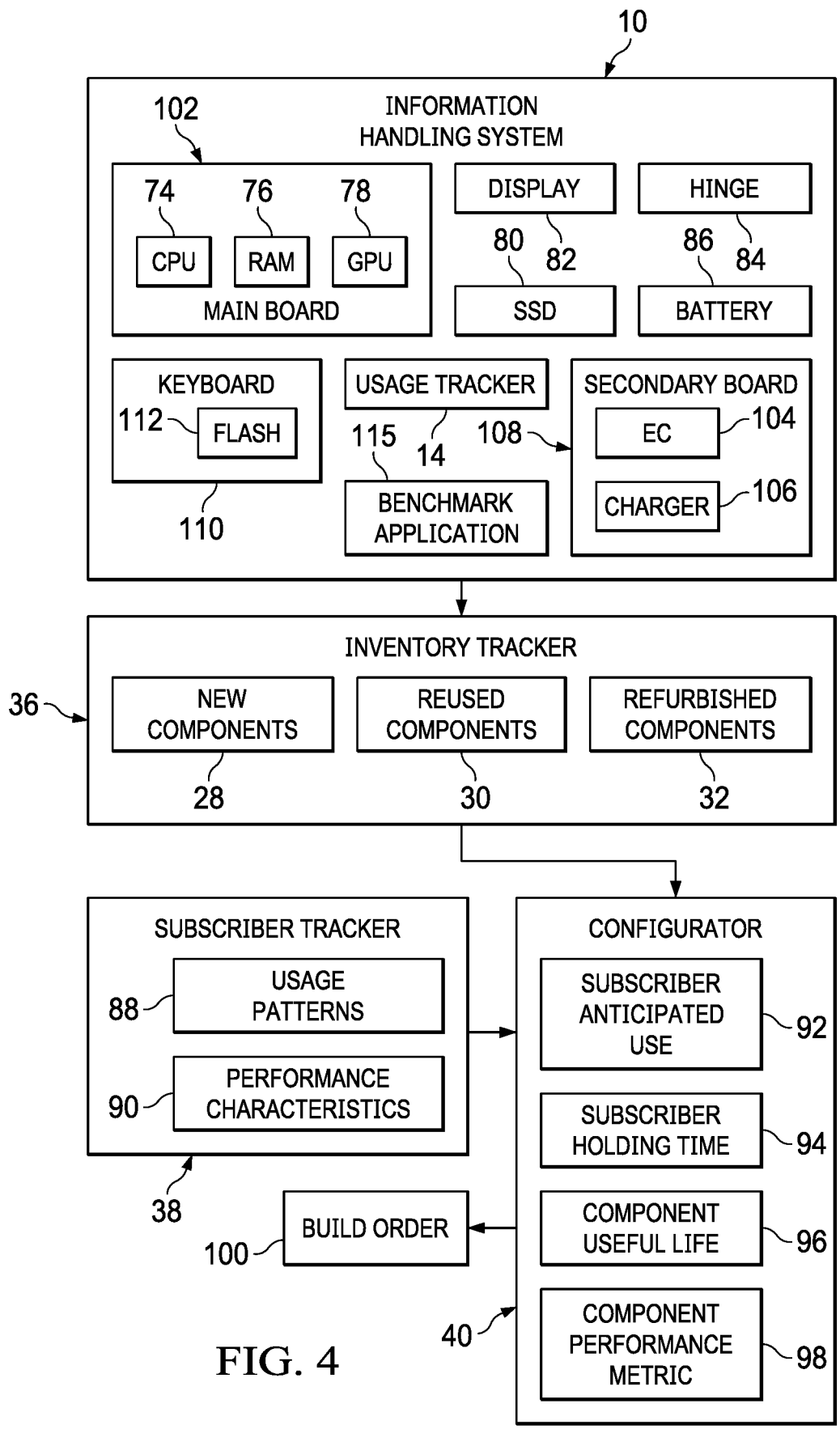
FIG. 4 depicts a block diagram of an example of a portable information handling system interfaced with a subscription manager that manages component reuse and refurbishment.

Referring now to FIG. 4, a block diagram depicts an example of a portable information handling system interfaced with subscription manager that manages component reuse and refurbishment. Information handling system 10 processes information with processing components disposed in a housing. In the example embodiments herein, the housing has a portable convertible configuration, however, in alternative embodiments other types of information handling systems may be used, such as tablet, desktop and server information handling systems. Main processing functions are performed by components on a main board 102 that includes a central processing unit (CPU) 74, random access memory (RAM) 76, and graphics processing unit (GPU) 78 on a printed circuit board (PCB) having a standardized size and shape to interchangeably couple to different-sized housings. For example, the processor and memory of main board 102 execute an operating system and applications that cooperate to process information for presentation by the graphics processor. Secondary processing functions are performed by a secondary board 108 that includes an embedded controller 104 to manage system power, thermals and input/output device interactions; and a charger 106 that exchanges power with a battery to charge and discharge current in cooperation with the availability of external power. Other components included in information handling system 10 are a solid state drive (SSD) 80 that provides persistent storage, a display 82 that presents visual images, a hinge 84 that rotationally couples housing portions to rotate a housing between open and closed positions, a battery 86 that charges and discharges power, and a keyboard 110 that integrates in the housing to accept end user key inputs. Information handling system 10 stores a usage tracker 14 that tracks component usage and a benchmark application 115 in a non-transitory memory, such as SSD 80 on flash of embedded controller 104. Component usage data and benchmark analysis data are reported to the subscription manager as described above, but may also be stored locally in persistent memory for retrieval at the return center after separation of the component from the information handling system. For example, keyboard 110 includes a counter that counts key inputs to track keyboard usable life and stores the count in flash memory 112 so that the count is available after separation of keyboard 110 from the information handling system.

Inventory tracker 36 interfaces with information handling system 10 to track the components of information handling system as part of the component inventory available for refurbishment. For example, components in deployed information handling systems are tracked as a deployed inventory separate from new components 28 that have not been used, reused components 30 that have been used and are available without a rework, and refurbished components 32 that have been used and reworked for reuse. The inventory is further tracked based upon useable life as reflected by usage detected by usage tracker 14. The useable life of reused components 30 is derived from the historical usage and also based upon benchmark application benchmark results that indicate performance metrics available from the components. Subscriber tracker 38 interfaces with usage tracker 14 and applies component usage information to derive usage patterns 88 of end user subscribers associated with the subscriber performance characteristics 90. Usage patterns are derived from analysis of component usage and offer predictive value regarding future use of an information handling system by a subscriber. Predictions of future component use compared against component useful life offers insight as to when an information handling system will wear to a point at which replacement of the system should be proactively initiated. Further, subscriber usage patterns 88 are suggestive of components used by configurator 40 when building a replacement information handling system for the subscriber. For instance, configurator 40 includes subscriber anticipated use logic 92 that predicts how the subscriber will wear components in the future and subscriber holding time logic 94 that compares performance characteristics of the subscriber against performance metrics of an information handling system to predict when the system will be outdated for the subscriber due to declining system performance and/or improving replacement system performance related to component performance enhancements. Based upon component useful life logic 96 and component performance metric logic 98 a build order 100 is applied for the subscriber's replacement system. Configurator 40 is, for example, artificial intelligence logic that weighs a variety of considerations to define information handling system replacements that optimize end user experiences while driving down system costs and enhancing component full life cycles.

Figure 5:
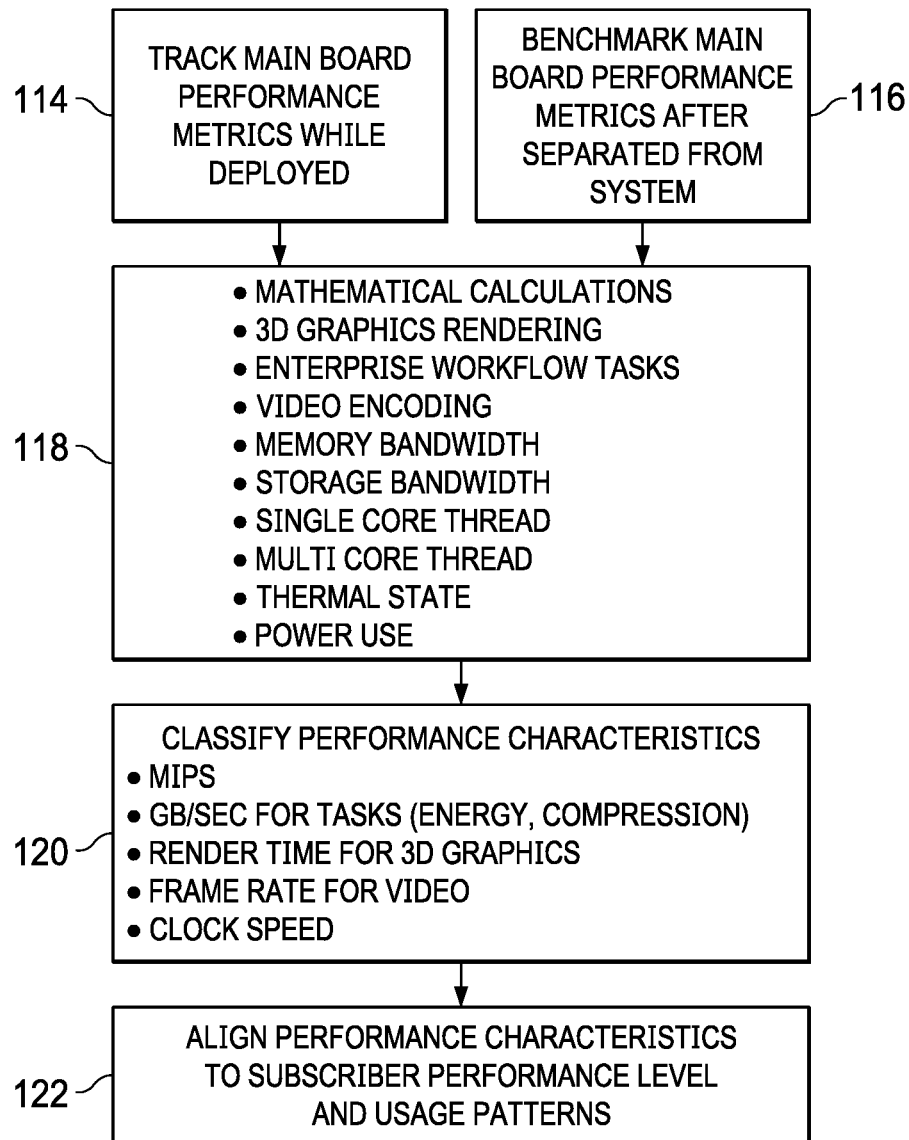
FIG. 5 depicts a flow diagram of a process for use of system performance metrics to automate main board disposition.

Referring now to FIG. 5, a flow diagram depicts a process for use of system performance metrics to automate main board disposition. The process starts at step 114 by tracking main board performance metrics while deployed in an operational state to subscribers. In the field, main board performance metrics may be tracked by analyzing normal operational functions, such as performance of processing functions in defined time periods and failures that result in system resets or reboots. As an example, memory faults may result in slower processing and more resets that are collected as part of normal system diagnostics. In addition, benchmarking applications may execute periodically in the field to determine main board performance against a known processing task or load. At step 116, when a main board arrives at a return center and is separated from the information handling system, a benchmark of the main board can be performed on a tester that interfaces through the main board connectors. Benchmarking on a tester provides a hard comparison executing a set workload against benchmarked devices in a standardized set of conditions. Using the operational performance metrics and/or return center benchmark test, CPU and memory performance compares against benchmarked performance for each type of main board to provide an equivalent main board rating that defines specified performance for reuse in a refurbished information handling system.

Some examples of benchmarked performance metrics are depicted in step 118 and include single thread benchmarking, multi-thread benchmarking, thermal performance and power/battery life performance. Additional benchmark metrics may be derived from mathematical calculations, three dimensional rendering, timed enterprise workflow tasks like running word processing or CAD applications, video encoding, memory bandwidth, and storage bandwidth. Once the benchmark metrics are determined, at step 120 the main board is assigned a rating that corresponds to subscription performance characteristics, such as a rating of millions of instructions per second, GB per second to perform defined tasks like encryption and compression, render time for three dimensional graphics, framerate for video and clock speed.

At step 122, the performance characteristics are aligned with subscriber performance levels and usage patterns to assign the main board to a bin for use in a refurbished system. As an example, a three year old Intel I9 processor could have an equivalent performance of a currently shipping i5 processor. Using each processor's empirical performance data a determination is made of a subscription level for the main board or, in the case of suboptimal performance, a recycling of the main board. In some instances, parts of the main board may be recycled and used in a refurbished main board, such as where bad memory metrics isolate memory as a failure source for a main board with a processor and other components operating normally. Using performance metrics to assign a score to each main board and applying the score with artificial intelligence optimization allows performance to be more effectively allocated based upon end user usage patterns. For example, a gaming system might receive a main board with higher three dimensional rendering and framerate scores while an enterprise system would weigh more heavily to receive a score that is high business application workflow productivity tasks.

Figure 6:
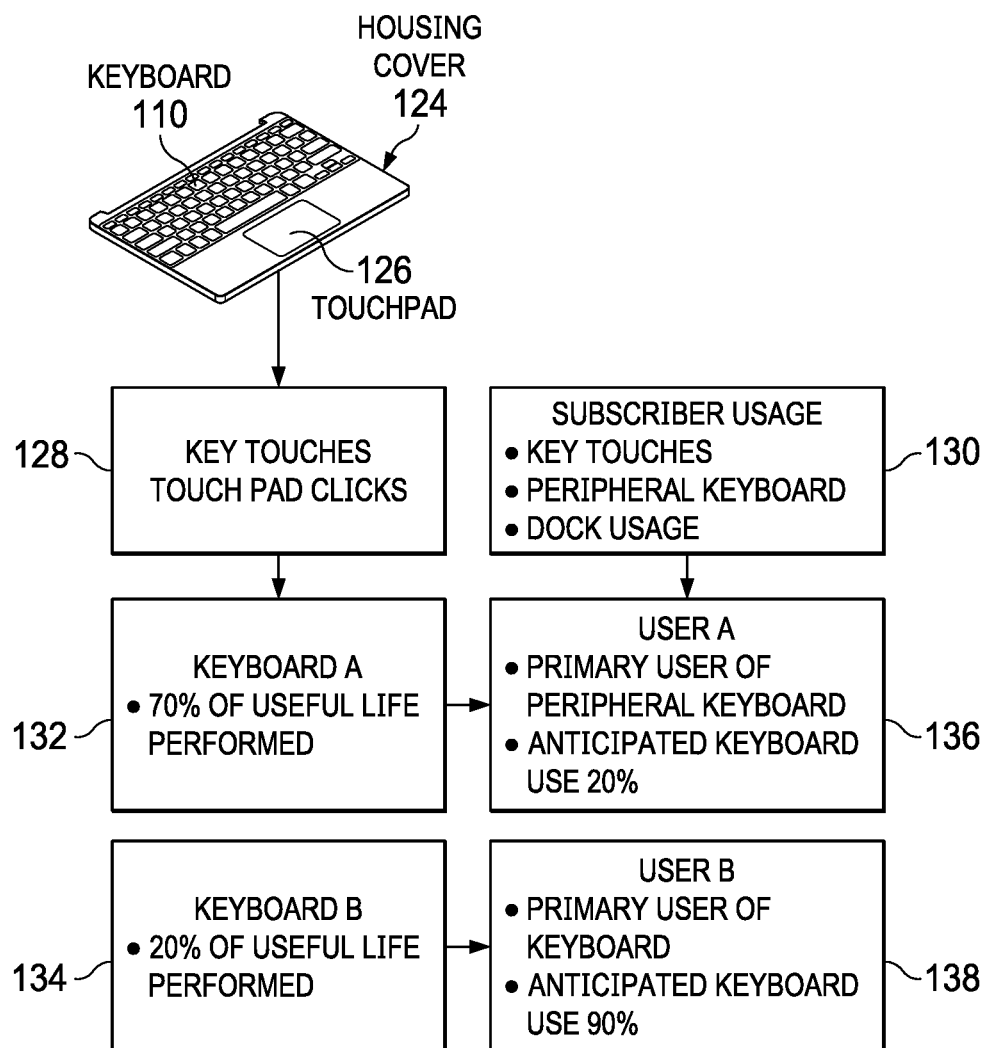
FIG. 6 depicts a flow diagram of a process for tracking and applying keyboard and touchpad usage information to assign keyboards and touchpads for refurbishment.

Referring now to FIG. 6, a flow diagram depicts a process for tracking and applying keyboard and touchpad usage information to assign keyboards and touchpads for reuse or refurbishment. In the example embodiment, a keyboard 110 and touchpad 126 integrate with a housing cover 124 that couples to a housing to contain processing components within the housing. Keyboard 110 and touchpad 126 define a component unit for refurbishment and reuse, although in alternative embodiments the keyboard and touchpad may separate from the housing cover at a return center. At step 128 a counter of the keyboard tracks a number of keyboard touches and touchpad clicks to estimate a remaining useful life, such as by storing the usage information in flash memory of the keyboard. At step 130 subscriber usage detected in the field is also separately reported for the keyboard, such as keyboard touches, peripheral keyboard interactions and dock usage, which can indicate the housing remains closed over top of the keyboard. The usage data is then applied to define a reuse and/or refurbishment plan for the keyboard and touchpad contiguous unit in the cover. In the example embodiment, at step 132 a keyboard A has 70% of its useful life performed and a keyboard B has 20% of its life performed. The useful life estimate may include touch inputs and various other factors that determine an overall keyboard reuse score, such as a system used in a closed housing position, a system used while mobile as indicated by accelerations, a system used while docked and other factors that indicate the risk of contaminants entering the keyboard. Once the usable life of each keyboard and touchpad in each housing cover is scored, refurbished information handling systems are assembled from the reused housing covers by applying the usable life remaining against each user's usage patterns for keyboards. In the example embodiment, user A 136 who primarily uses a peripheral keyboard and has an anticipated keyboard useable life usage of 20% for the deployment of the information handling system has Keyboard A assigned; and user B 138 who primarily uses the integrated keyboard and has an anticipated keyboard use of 90% has keyboard B 134 assigned. Similar component reuse and refurbishment assignments may be used for other types of components as described below.

Figure 7:
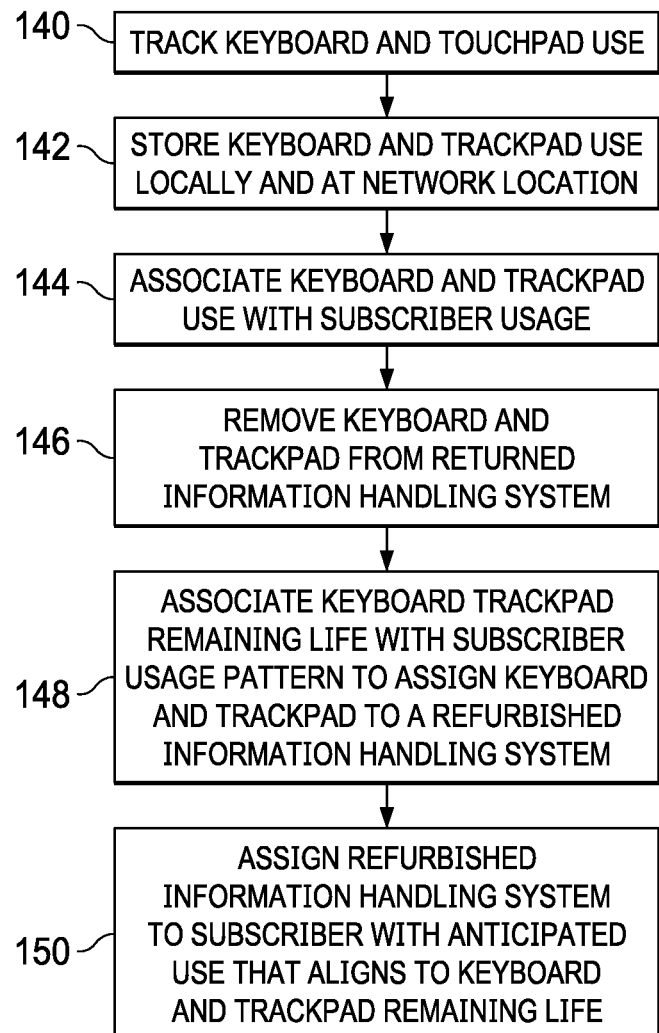
FIG. 7 depicts a flow diagram of a process for assigning keyboards for reuse in refurbished information handling systems.

Referring now to FIG. 7, a flow diagram depicts a process for assigning keyboards for reuse in refurbished information handling systems. The process starts at step 140 by tracking the keyboard and touchpad use at the information handling system. At step 142 the keyboard and touchpad use is stored locally, such as in keyboard and embedded controller flash, and at a network location, such as by communication to a cloud location. At step 144, the keyboard and touchpad use is associated with a subscriber to track subscriber usage patterns. At step 146, the keyboard and touchpad are removed from a returned information handling system, such as by disassembly of a housing cover that includes the keyboard and touchpad. At removal, locally stored usage information may be retrieved and associated with the information handling system and subscriber. At step 148, the keyboard and touchpad remaining life score is associated with a subscriber usage pattern to assign the keyboard and touchpad to a refurbished information handling system. At step 150, the refurbished information handling system is assigned to a subscriber with an anticipated keyboard use that aligns with the subscriber usage pattern and thereby the keyboard and touchpad remaining life. The process provides an example for assignment of a keyboard component by balancing useful life with subscriber needs, however, in alternative embodiments the process may be applied to other components including main boards, secondary boards, batteries, SSDs etc.

Figure 8:
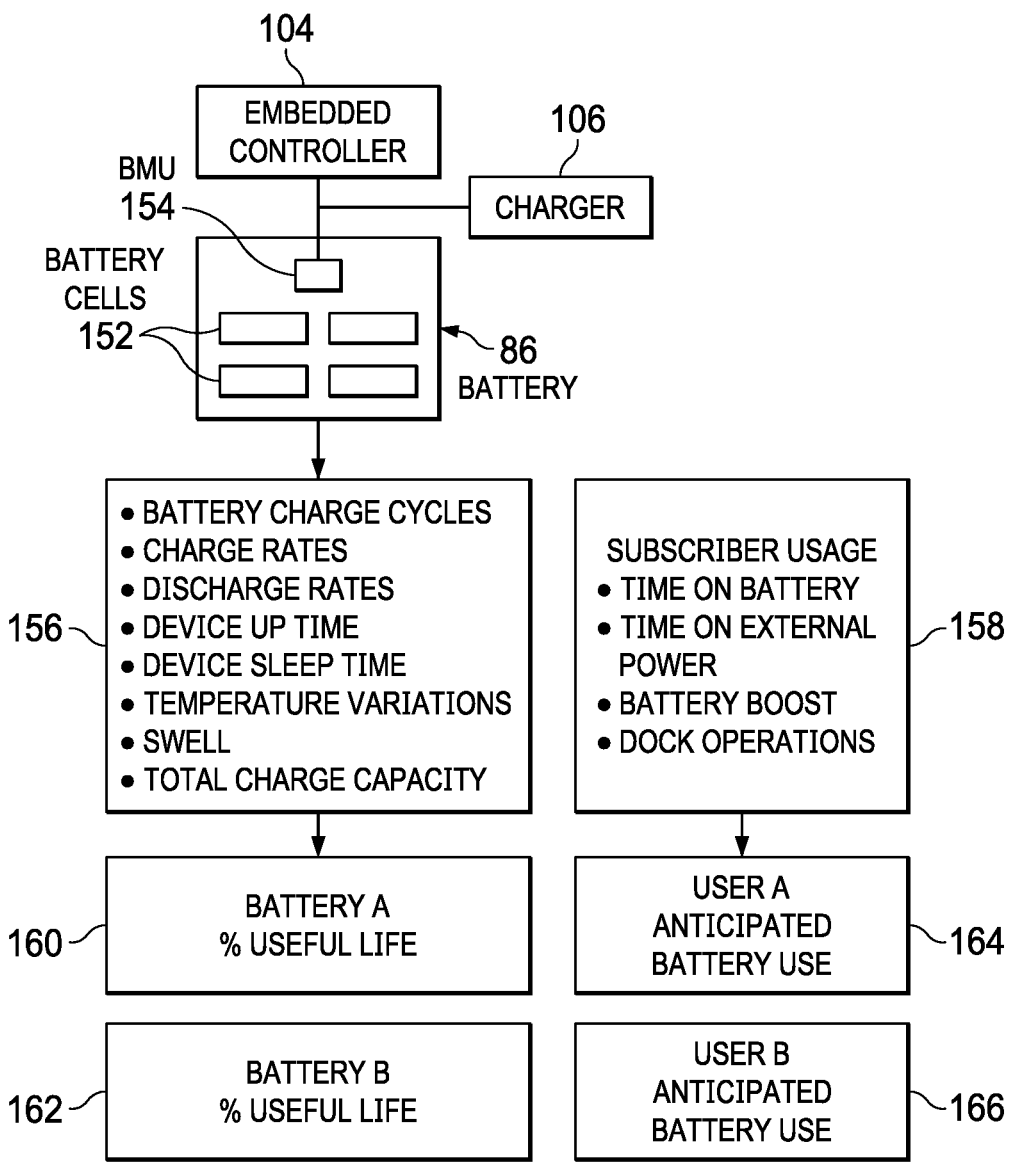
FIG. 8 depicts a flow diagram of a process for tracking and applying battery usage information to assign a battery for reuse or refurbishment.

Referring now to FIG. 8, a flow diagram depicts a process for tracking and applying battery usage information to assign a battery for reuse or refurbishment. In the example embodiment, logic executing on embedded controller 104 interfaces with charger 106 and a battery management unit (BMU) 154 of battery 86 to track battery operations in the field, including the states of battery cells 152 that cooperate to generate a battery native voltage. Battery performance metrics tracked during normal operations include those depicted at step 156: battery charge cycles, charge rates, discharge rates, system on time, system sleep time, temperature variations, battery swell and battery total charge capacity. In some situations, battery performance metrics indicate battery end of life to initiate a return of the information handling system for recycling. In some instances, a failed battery cell may indicate a return of the information handling system to refurbish the battery by replacement of a bad battery cell. In some instances, a returned information handling system may have a battery that has usable life remaining so that the battery can be reused in a refurbished information handling system. As an example, battery use is applied at step 158 to associate with a subscriber using the system and define a battery usage pattern for the subscriber. Subscriber use may include time running an information handling system on battery power versus external power, the use of battery boost for improved performance when on external power, and time spent in a docked or stationary configuration. For a battery A and B at steps 160 and 162, different remaining useful life is associated with subscriber A and B usage pattern anticipated battery use at steps 164 and 166 so that a more worn battery with less life remaining is refurbished to an information handling system that will have less battery use while a battery that has a greater remaining life is assigned to an information handling system for a subscriber who relies on the battery for a greater portion of operational use. As an example, a worn 8 cell battery may be assigned in the place of a 4 cell battery for an end user who does not rely on battery for extended periods of time but does use battery boost. Other factors may be applied in the assignment of the information handling system to a subscriber, such as the time that the subscriber is expected to keep that information handling system.

Figure 9:
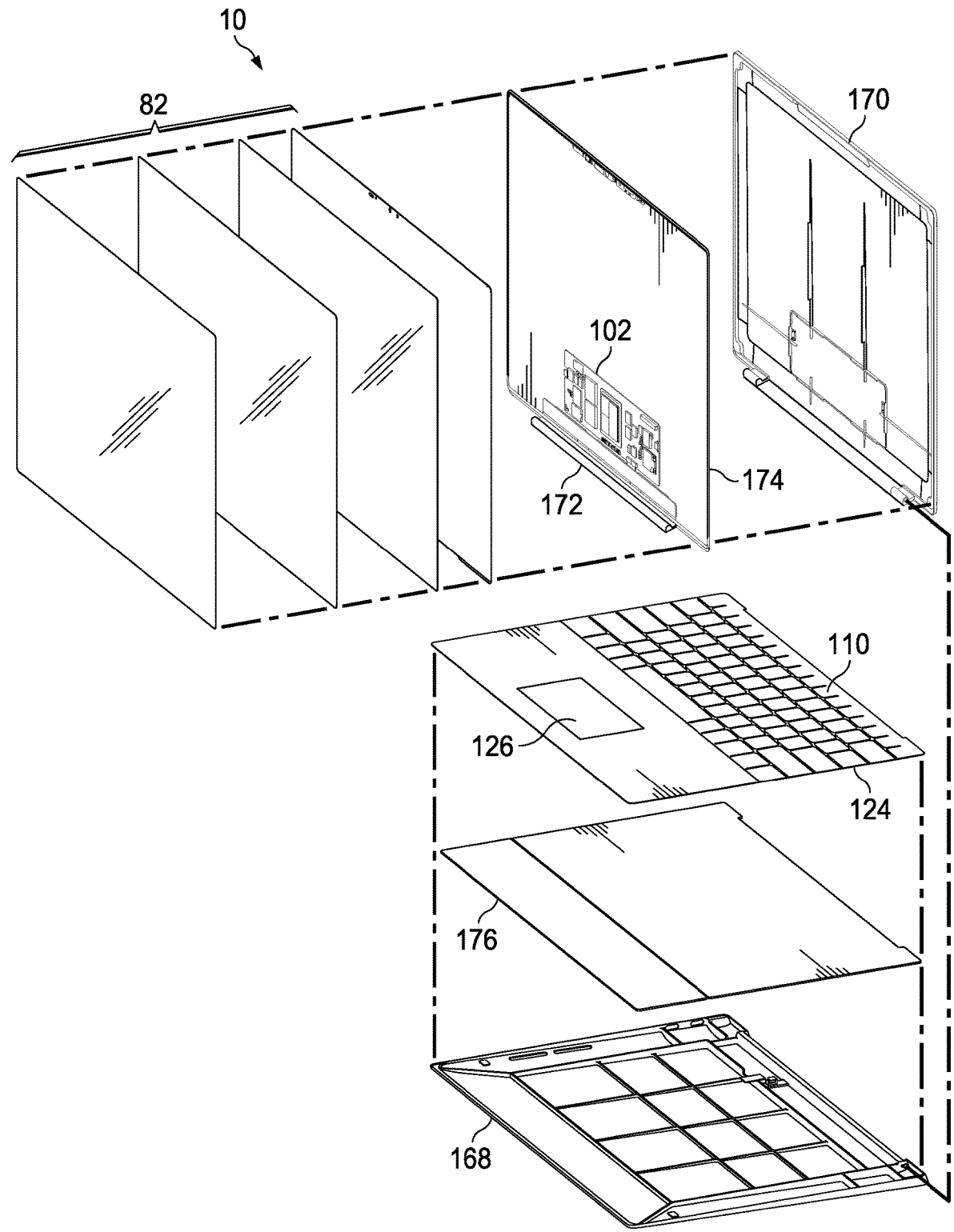
FIG. 9 depicts an exploded perspective view of one example embodiment of a modular hybrid portable information handling system architecture that supports recycling and refurbishment of interchangeable components.

Referring now to FIG. 9, an exploded perspective view depicts one example embodiment of a modular hybrid portable information handling system architecture that supports recycling and refurbishment of interchangeable components. Information handling system 10 separates into components that interchange through shared dimensions and communication interfaces. The housing of information handling system 10 has a main housing portion 168 that act as a base when the housing is in an open position and a lid housing portion 170 that supports a display 82 in a raised viewing position when the housing is open. A cover housing 124 includes a keyboard 110 and touchpad 126 that rests over main housing portion 168 to accept end user inputs. An intermediate support 176 can provide physical support with sheet metal or a replaceable gasket at the perimeter of housing cover 124 to protect internal components. A hinge 172 rotationally couples main housing portion 168 and lid housing portion 170 to rotate between open and closed positions. Main board 102 couples to lid housing portion 170 and is covered by display 82 with a backplate of display 82 providing a thermal sink for thermal energy of main board 102. A gasket 174 couples around the perimeter of lid housing portion to protect internal components. Although the example embodiment depicts a portable information handling system, an alternative embodiment may include a desktop or other stationary information handling system configuration. Further various size housings may be used to support similar internal components. For example, 15 and 17 inch diagonal dimension housing portions may share common main board and battery dimensions while having larger displays and keyboards.

Figure 10:
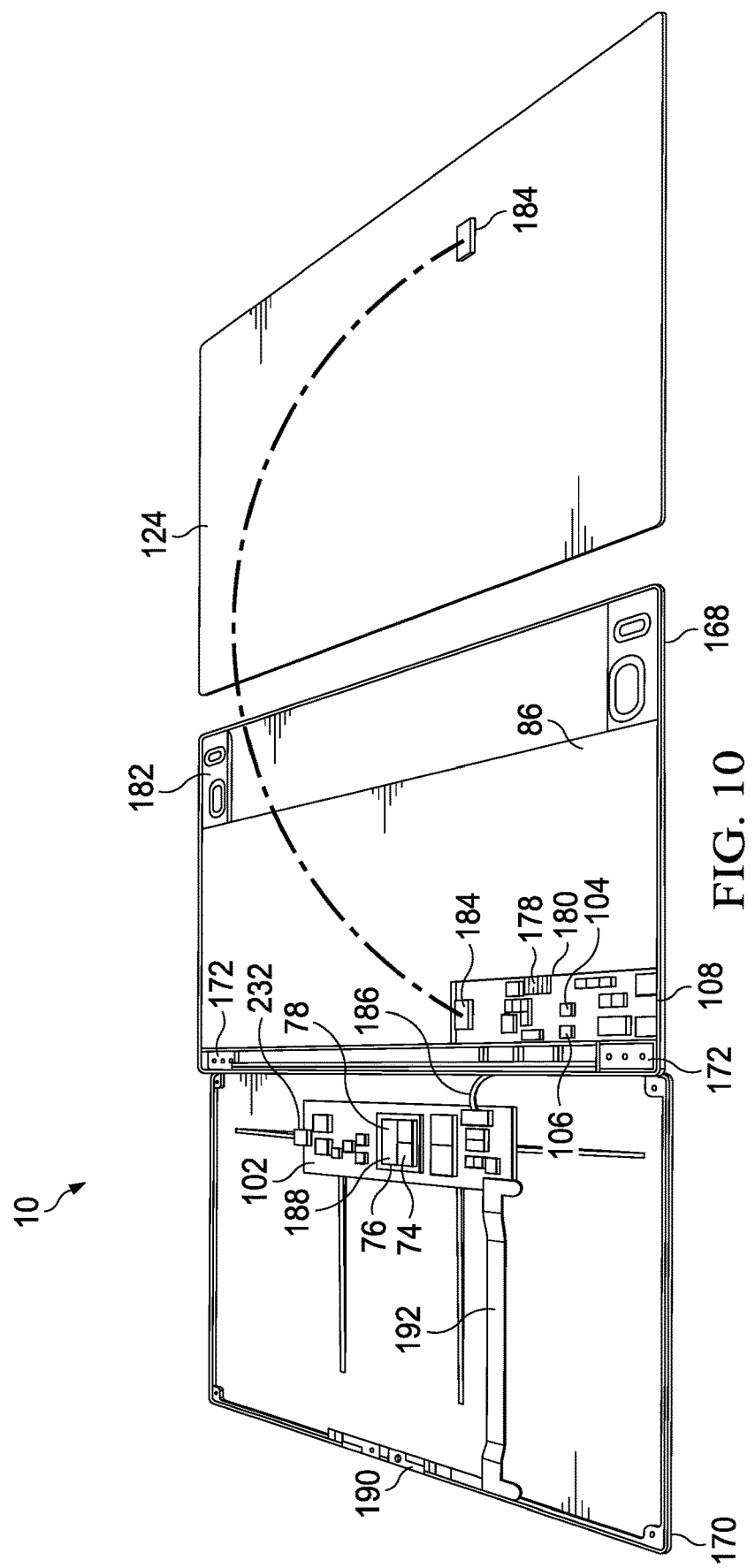
FIG. 10 depicts an upper perspective view of an information handling system with the display and housing cover removed illustrates an example of interchangeable components that support component reuse, refurbishment and recycling in a subscription population.

Referring now to FIG. 10, an upper perspective view of information handling system 10 with the display and housing cover 124 removed illustrates an example of interchangeable components that support component reuse, refurbishment and recycling in a subscription population. In the example embodiment, main board 102 couples to lid housing portion 170 with snap connectors 232 or other similarly pressure-releasable coupling device to aid in automate coupling and removing of main board 102, such as by a robotic arm. Main board 102 includes CPU 74, RAM 76 and GPU 78 to process information has a separable and independent component. A secondary board 108 couples to main housing portion 168, also with snap connectors or similar releasable coupling devices, and provides support functions that support operation of main board 102. For example, secondary board 108 includes an embedded controller that manages power and thermals, and a charger 106 that accepts external power to run the system and to charge and discharge a battery 86. A data and power coaxial cable 186 provides power and data communication between main board 102 and secondary board 108 with both power and data communicated through a single cable assembly that passes through hinge 172. Data and power coaxial cable 186 terminates with a common plug on both ends that couple to a connector on each of main board 102 and secondary board 108. In the example embodiment only one cable carries power and data between the lid and main housing portion so that assembly and disassembly of the main and secondary boards is readily performed with a tool-less approach.

In main housing portion 168, battery 86, speakers 182 and the keyboard of housing cover 124 also assemble in a modular fashion the tool-less release at disassembly that promotes robotic manipulation. Keyboard pogo pin pads 184 disposed on the bottom surface of housing cover 124 and interfaced with the keyboard aligns with a keyboard pogo pin interface 184 disposed at the upper side of secondary board 108 and interfaced with embedded controller 104. When housing cover 124 couples over main housing portion 168, keyboard pogo pin pads 184 align with keyboard pogo pin interface 184 of secondary board 108 to provide communication of keyboard inputs to embedded controller 104. By using a contact pin and contact pad interface, a modular system is provided that assembles and disassembles without tools or cable connectors that have to mate to communicate. Speakers 182 may communicate with secondary board 108 through a similar interface or in combination with the keyboard pogo pin pads 184, such as with interface wires that run through housing cover 124. Alternatively, speakers 182 may communicate with interfaces that run through battery 86, which communicates by a contact pad of a battery connector 178 aligned with a battery interface 180 integrated with secondary board 108. Different housing dimensions and components may interchange by defining the location for the contacts to align within main housing portion 168. All components are placed in a manner that provides room for manipulation by a robotic arm or other automated assembly and disassembly device. A similar approach is provide at main board 102 with a flexible cable 192 that interfaces with a camera and accessories 190 and a GPU connector 188 that aligns with pogo pin contacts of a display to communicate visual information to the display timing controller. Alternatively, GPU 78 may communicate with a side connection contact as described below.

The modular hybrid component architecture separates battery, speaker, battery charger, keyboard and touchpad from the display, main board, camera and WiFi at a hinge connection with a single cable interfacing the separate housing portions. The main board directly interfaces with the display TCON for ready assembly and disassembly to the display to the housing. Separating the battery charger from the main board enables the architecture to support higher thermal levels. A high speed Thunderbolt (TBT) connection between the main board and secondary board aggregates the majority of the signaling used between the boards allowing for reduced cabling and, in the example embodiment, a single cable for power and data. The separated main and secondary boards helps to make the main board generic and leverageable across multiple system platform types and form factors while supporting customization at the secondary board to support specific input/output ports, battery charging, battery sizes, keyboard layouts and audio quality.

Figure 11:
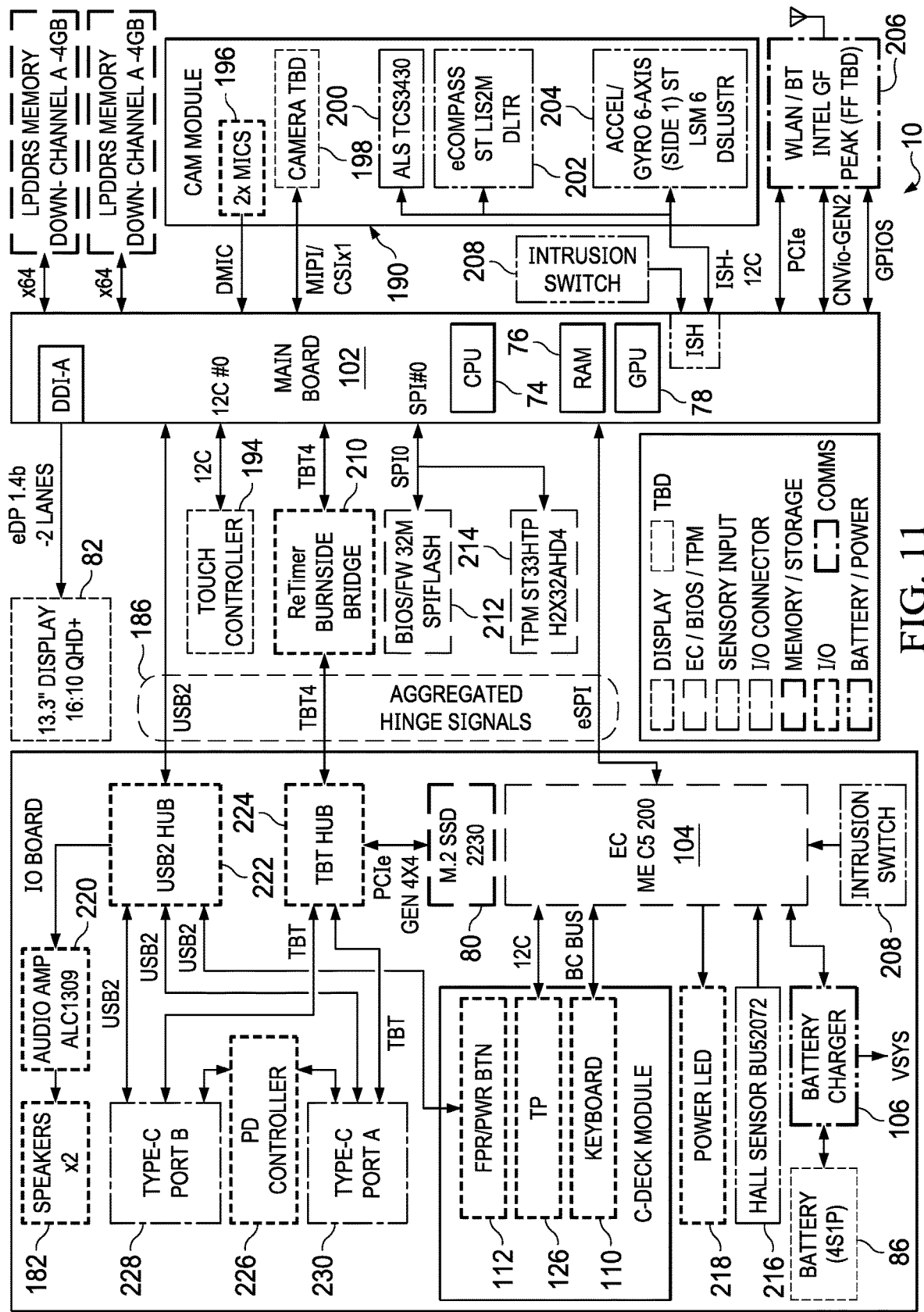
FIG. 11 depicts a circuit block diagram of an example embodiment of a modular hybrid portable information handling system architecture that supports recycling and refurbishment of interchangeable components.

Referring now to FIG. 11, a circuit block diagram depicts an example embodiment of a modular hybrid portable information handling system architecture that supports recycling and refurbishment of interchangeable components. Information handling system 10 has a main board 102 and a secondary board 108 interfaced through a data and power coaxial cable 186 passed through a hinge. Main board 102 includes a CPU 74, RAM 76 and GPU 78 that cooperate to process information with power provided from secondary board 108. Display 82 directly interfaces with main board 102 through a eDP or similar link includes a touch controller 194 that communicates through a direct I2C link. In the example embodiment, RAM 76 couples to sockets included in main board 102, although a separate memory board and socket may be used. Camera and accessory module 190 includes microphones 196, a camera module 198, an ambient light sensor 200 and compass 202 and an accelerometer 204 that interface through a flexible cable with main board 102. A wireless network interface controller 206 supports wireless local area network (WLAN) and wireless personal area network (WPAN) communications for main board 102. A BIOS/firmware flash 212 provides firmware instructions that manage main board boot, such as by running on a trusted platform module 214 processing resource. An intrusion switch 20 detects access to the interior of the housing portion having main board 102 and, separately, the housing portion having secondary board 108.

Secondary board 108 supports input and output device interactions and manages application of power to main board 102. An embedded controller 104 interfaces with main board 102 through a SPI link and controls inputs of keyboard 110, touchpad 126 and a power button 112 that commands application of power to the system. Embedded controller 104 interfaces with charger 106 to manage charge and discharge of battery 86 that interfaces the system voltage bus. A Hall sensor 216 detects opening and closing of the housing, such as by sensing a magnet in the other housing portion and a power LED 218 illuminates when power is applied to the system. Communication between secondary board 108 and main board 102 is provided by a Thunderbolt link of a Thunderbolt hub 224 interfaced with a bridge 210 of main board 102. For example, audio information is communicated through Thunderbolt hub 224 to an audio controller 220 for presentation at speakers 182. A USB hub 222 supports interfaces with external devices through Type-C ports 228 and 230 and application of external power from a port through a power controller 226. In the example embodiment, power is communicated across the hinge with power lines of the USB and/or Thunderbolt cables. An SSD 80 couples to a M.2 socket of secondary board 108 and interfaces with main board 102 through Thunderbolt hub 224. The example embodiment provides a modular architecture that offers discrete components to reuse and refurbish. Alternative embodiments may establish different components that will provide effective and efficient reuse, refurbishment and recycling.

Figure 12:
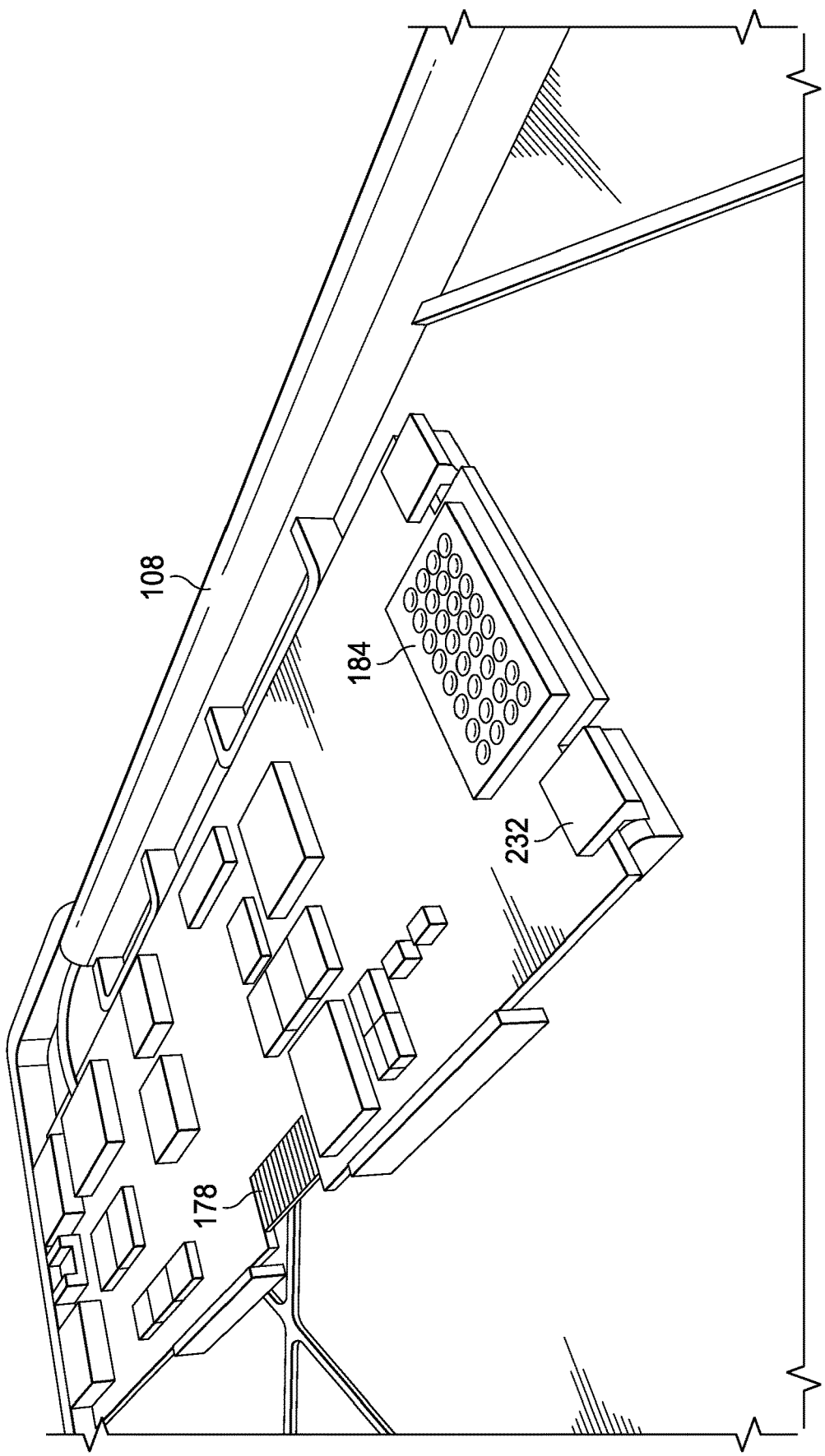
FIG. 12 depicts a detailed perspective view of an example of contact connectors of a secondary board that support modular information handling system assembly.

Referring now to FIG. 12, a detailed perspective view depicts an example of contact connectors of a secondary board 108 that support modular information handling system assembly. In the example embodiment, snap connectors 232 integrated in the information handling system housing couple secondary board 108 to the housing in a tool-less manner to release when a predetermined pressure is applied, such as in response to a robotic arm lifting force at secondary board 108. Assembly of secondary board 108 is accomplished by pressing secondary board 108 into place to engage its perimeter with snap connectors 232. Keyboard pogo pin interface 184 is exposed at the upper surface of secondary board 108 and aligned to contact against keyboard contact pads exposed at the lower surface of the housing cover. In the example embodiment the pogo pin contacts are biased upwards towards the housing cover keyboard contact pads, however, other types of contact connectors may be used, such as with the biased pins in the housing cover and pads on secondary board 108 or with magnetic connectors. For ease of assembly and disassembly, the contact interfaces should establish a signal interface with the assembly of the housing cover and without a separate interaction to couple connectors. Battery connector 178 has a similar contact interface function in which the assembly of the battery in the housing next to secondar board 108 establishes the power communication interface by contact and without a separate cable connection step. That is, the mechanical assembly process of coupling a battery and housing cover in place also secures the electrical interfaces of the secondary board. In one embodiment described below, speaker contacts are also provided by the keyboard pogo pin interface 184 with wires provided through the keyboard to align with the speakers when the housing cover couples in place.

Figure 13A:
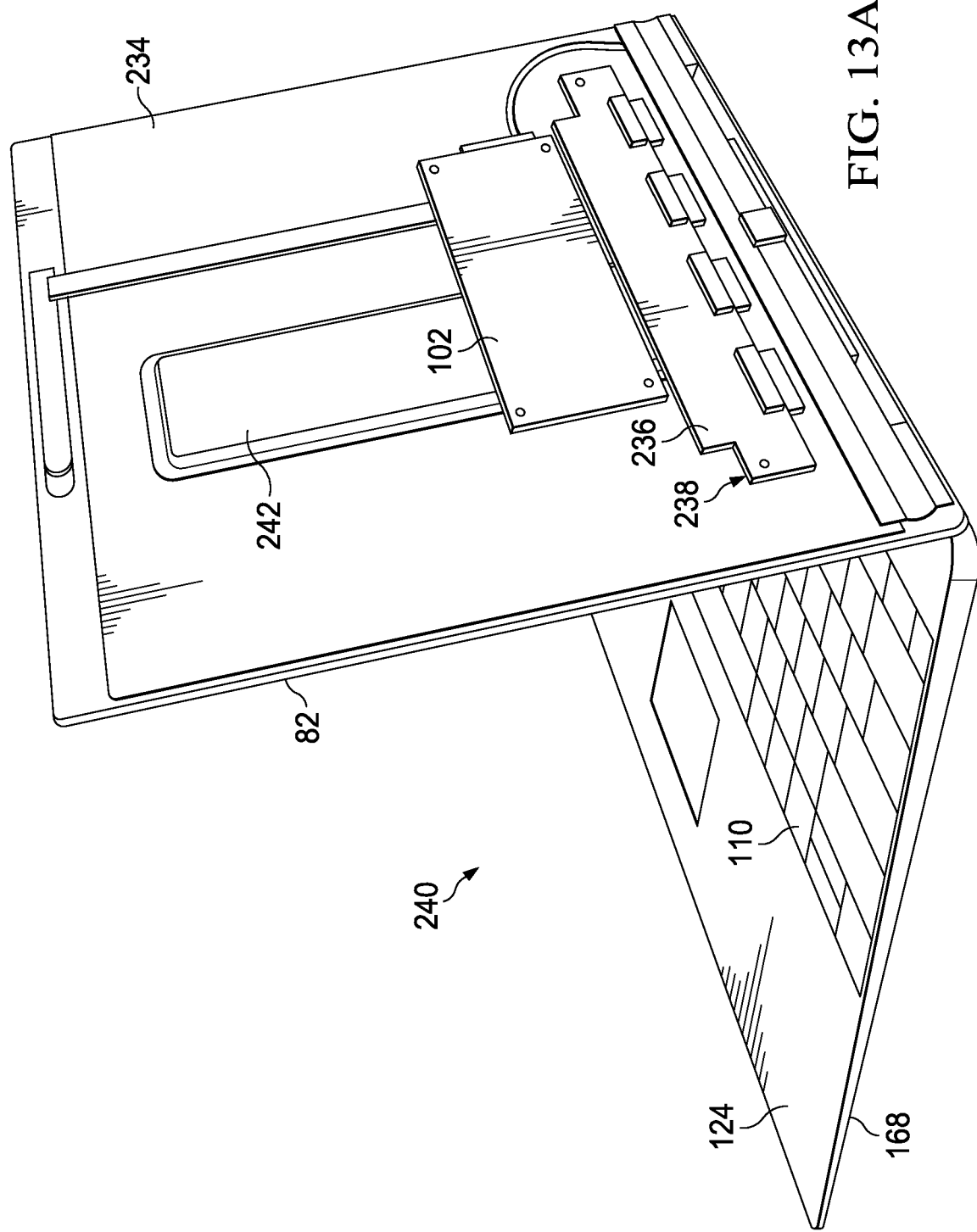
FIGS. 13A, 13B and 13C depict a vapor chamber integrated in a display backplate that provides thermal management for processing components of a main board.
Figure 13B:
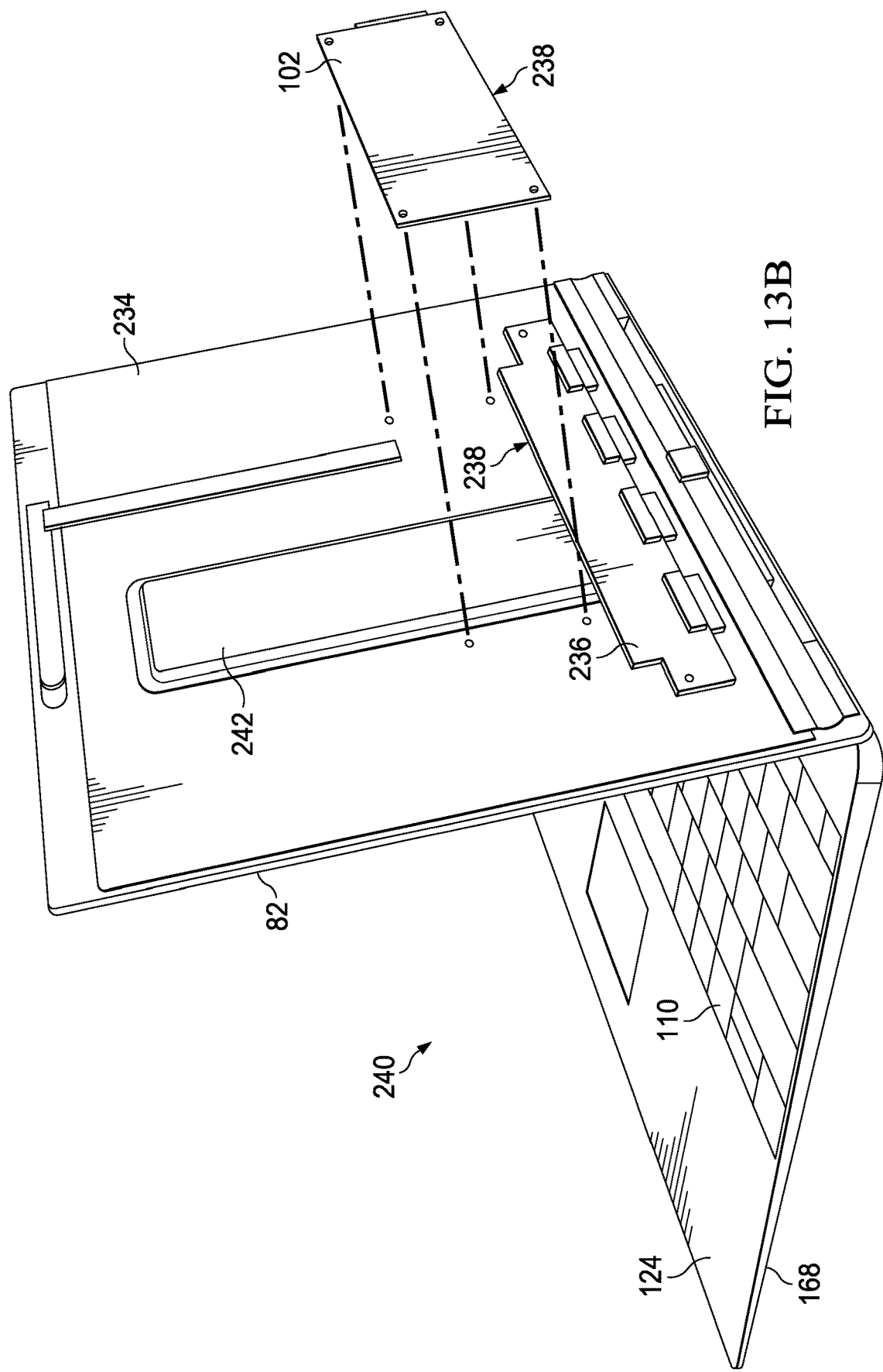
Figure 13C:
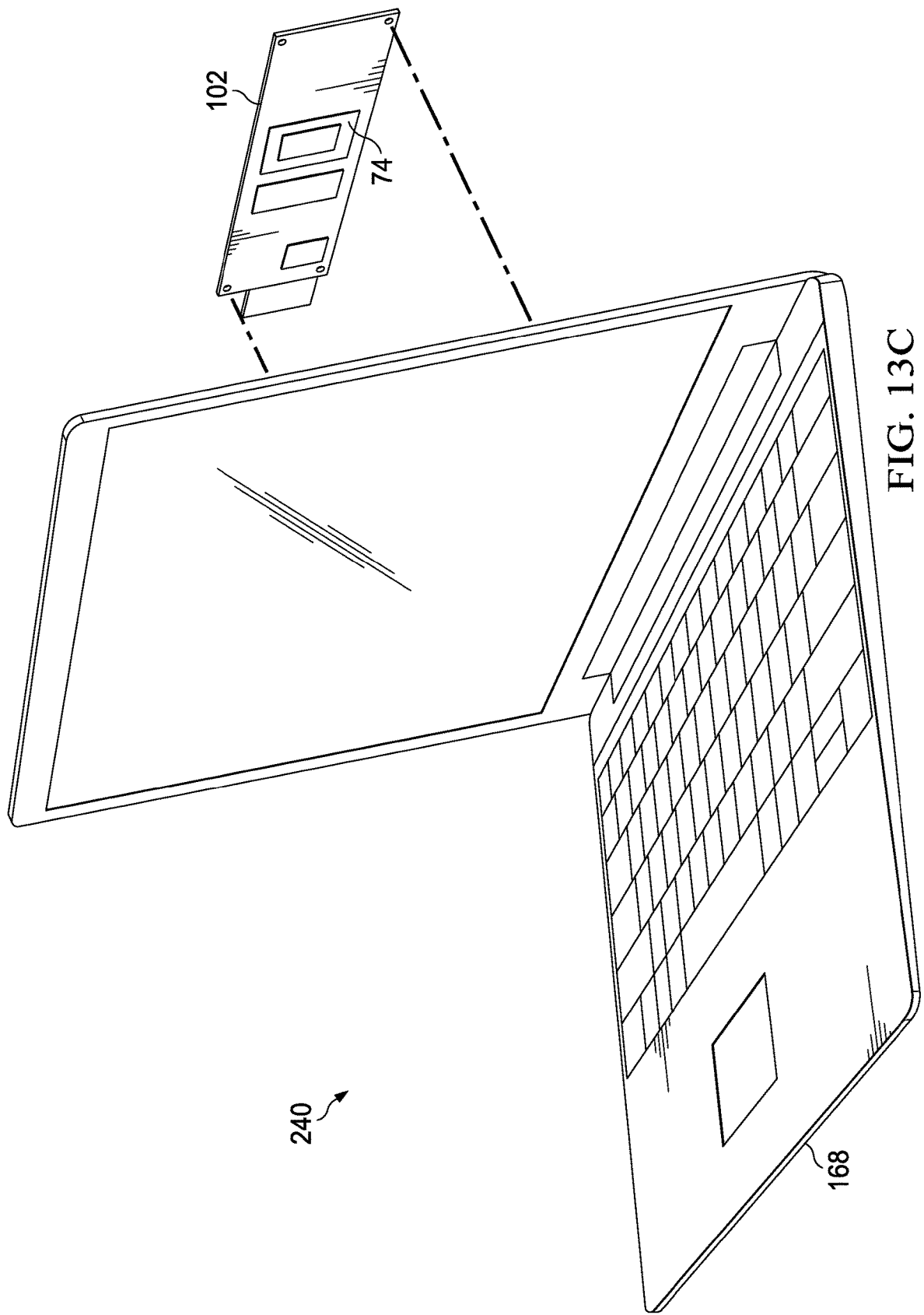

Referring now to FIGS. 13A, 13B and 13C, a vapor chamber 242 integrated in a display backplate is depicted that provides thermal management for processing components of a main board. FIG. 13A depicts a rear perspective view of information handling system 10 having the lid portion of housing 240 removed to expose a backplate 234 of display 82. Main board 102 couples against backplate 234 to transfer thermal energy of the CPU to thermally conductive material of backplate 234 as described in greater detail below. A timing controller board 236 includes the timing controller and other supporting components for presenting visual images at the display with a graphics interface 238 communicating the visual information by a contact interface, such as opposing pogo pins and contact pads or an interlocking connector similar to the battery connector. Main housing portion 168 and housing cover 124 assemble to have keyboard 110 available to accept typed inputs while the lid housing portion (not shown) that holds display 82 is rotated to a raised viewing position. FIG. 13B depicts main board 102 lifted away from backplate 234 where a thermal interface is provided to vapor chamber 242 to transfer excess thermal energy of the CPU and other main board components to backplate 234 for distribution to housing 240. For example, backplate 234 thermally interfaces with the lid housing portion of housing 240 so that excess thermal energy is distributed across the housing and rejected to the external environment. FIG. 13C depicts a front perspective view of main board 102 and CPU 74 aligned to thermally interface with vapor chamber 242. The thermal interface may be enhanced by thermal grease or other thermally conductive enhancement materials. The graphics interface 238 supports modular assembly of main board 102 in a similar manner to that described above with respect to the secondary board. In addition to providing thermal transfer, vapor chamber 242 provides additional structure and support that stiffens housing 240. For example, vapor chamber 242 is assembled into an opening formed in backplate 234 and integrated in place.

Figures 14, 15:
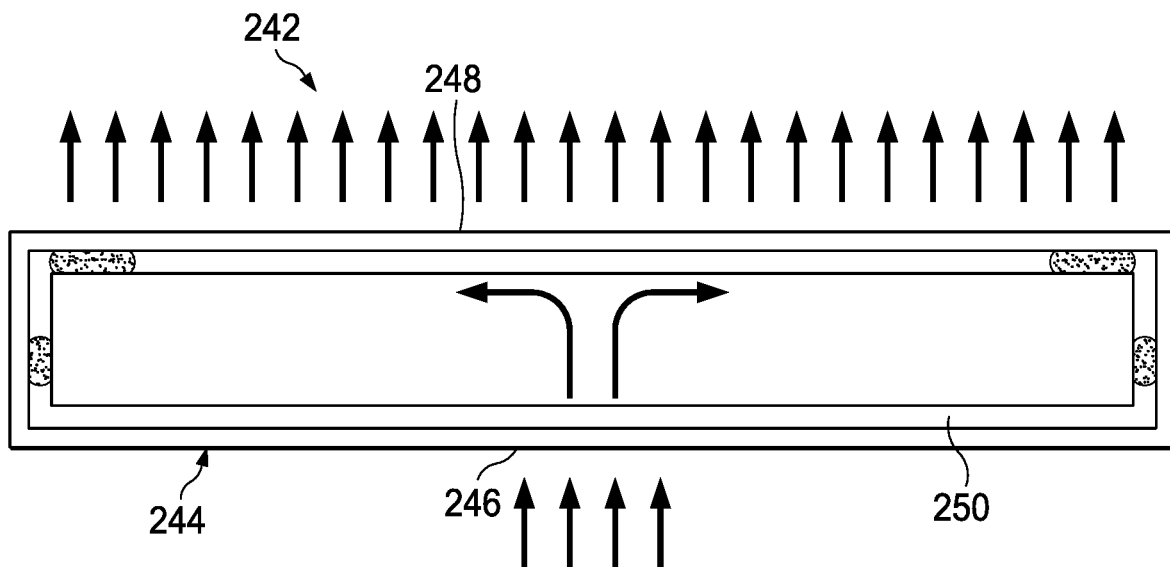
FIG. 14 depicts a side sectional view of an example of a vapor chamber that integrates with a display backplate.
FIG. 15 depicts an example of dimensions used in a vapor chamber integrated in a display backplate.

Referring now to FIG. 14, a side sectional view depicts an example of a vapor chamber that integrates with a display backplate. Vapor chamber 242 includes a fluid, such as water at a reduced pressure, that transfers thermal energy by leveraging phase change of the fluid. At a heat input surface 246 the introduction of thermal energy results in absorption of the thermal energy with a phase change from a liquid to a gaseous state. The phase change absorbs increased amounts of thermal energy at a relatively stable temperature and then in a gaseous phase moves toward a heat output surface 248 where the thermal energy is released as the fluid changes from the gaseous phase to the liquid phase. A wick 250 at the heat input surface 246 of the vapor chamber seal envelope 244 attracts the fluid in the liquid phase to promote efficient heat transfer with movement of the fluid within the envelope. In the example information handling system the heat output surface is exposed to both the display side and housing side of the lid housing portion with the thermal energy dissipated across the surface of the housing to provide a large surface area for thermal rejection.

Referring now to FIG. 15, an example is presented of dimensions used in a vapor chamber integrated in a display backplate. One approach is to have a separate vapor chamber that couples to the outer side of the display backplate for an overall thickness of 6.78 mm. Another approach is to integrated the vapor chamber within an opening cut in the backplate so that, essentially, one side of the backplate forms the envelope of the vapor chamber for an overall thickness of 5.98 mm. The A cover, or outer surface of the lid housing portion acts as a heat sink and thermal transfer surface that receives thermal energy from the vapor chamber at the change of phase from gaseous to liquid. A graphite or graphene layered sheet helps to distribute the thermal energy towards the perimeter of the A cover and has an insulation effect that limits direct thermal transfer to the housing central regions to help avoid hot spots. A thermal block, such as an aluminum or copper heat sink, interfaces the CPU and vapor chamber to encourage thermal transfer. An air gap and second graphite sheet between the vapor chamber and LCD panel helps to insulate the LCD panel from direct heat transfer and thermal hotspots.

Referring now to FIG. 16, a circuit block diagram depicts a system for transfer of power from a secondary board to a primary board across a hinge 172. To provide a robust cross-hinge cable interface that is reusable in a modular information handling system architecture, efficient and space-effective power transfer is provided with a high voltage sourced at the secondary board that is stepped down at the main board. In the example embodiment, power is transferred across the data and power coaxial cable 186 at a native voltage of battery 86 and then stepped down at the main board with a programmable X:1 switched capacitor voltage regulator 252 to a system voltage of the main board. A lithium ion battery 86 will multiple cells provides a native voltage of approximately 48 VDC, although other types of batteries may be used, such as LiFePO batteries. The use of a high voltage and corresponding low current to transfer the current shrinks the cable requirements, such as much as 6X that of standard 7.4V cabling in common use. Switched capacitor voltage regulator 252 steps down the native battery voltage to the system power 256 voltage, such as approximately 8 VDC, for use by the main board. As battery discharge results in reduced battery native voltage over time, a voltage control logic 254 switches the divider ratio to keep the system voltage within defined constraints. For example, with a 48V native battery voltage that has a maximum voltage of approximately 51.6 VDC, divider ratios of 7:1; 6:1 and 5:1 are commanded as the native voltage decreases due to discharge. The battery native voltage may be measured at the main board or at the secondary board and then communicated to the main board. For instance, a BMU or charger battery value may be used by voltage control logic 254, which can execute on a controller of the main board or a controller of the secondary board, such as the embedded controller or the charger.

Referring now to FIG. 17, a table depicts divider ratios for use with a switched capacitor voltage regulator to manage high voltage transfer to a main board. The table indicates examples of native battery voltage as the battery discharges versus the stepped down voltage provided by each of the available divider ratios. The divider ratio is selected to maintain a desired system voltage based on the native voltage and other conditions, such as system power draw, system power state, external power availability and other factors. FIG. 18 depicts the divider ratios graphically for the battery native voltage over a battery discharge for use in an example embodiment.

Referring now to FIG. 19, a flow diagram depicts a process for use of battery metrics to automate battery disposition of an information handling system. Information handling systems track a wide variety of battery metrics when operational in the field at both a BMU and secondary board level, such as battery charge cycles, charge rates, discharge rates, device up time, sleep time, temperature variations, battery swell and total charge capacity. When defined criteria are met for these metrics, battery replacement is typically called for. The process monitors the battery metrics to determine when battery replacement is called for and automates a determination of whether a battery is reused, refurbished or recycled. For instance, as described above, artificial intelligence that monitors a population of battery metrics applies the sensed metrics to address the allocation of new, reused and recycled batteries in a subscription population. The process starts at step 260 and at step 262 determines if an information handling system is returned for service or dispositions, such as to swap out a subscription system. If a battery is in a system returned for disposition, the process continues to step 266 to determine the type of disposition that should be taken, such as repair of the system at step 270, refurbishment of the system at step 282 or recycling of the system at step 292. If at step 262 the system is not returned for disposition, battery metrics are read remotely to determine if battery service is required. If battery change is called for, the process ends at step 280 with the system shipped for return to then have the disposition determined at step 266. If no battery service is required at step 264, the process returns to step 260 to continue periodic monitoring of the battery.

When a system is returned for disposition, the battery metrics may be retrieved from the system directly and/or from monitored battery metrics gathered remotely and stored. If the information handling system needs other repairs at step 270, the process continues to step 272 to compare the battery health against a replacement threshold. If the battery health is below the threshold, the system continues to step 274 to recycle the battery and replace it with a refurbished or new battery. If the battery health is sufficient, the process continues to step 276 to keep the battery and step 278 to repair the system, then ends at step 280 with return of the repaired system. If the system disposition is a refurbishment at step 282, the process continues to step 284 to determine if the battery health is greater than a refurbishment threshold. If below that threshold, the process continues to step 286 to recycle the system battery and replace the battery in the information handling system with a refurbished battery. If the battery is above the threshold, the process continues to step 288 to refurbish the battery for use in an information handling system, then to step 290 to build the information handling system for an end user, and then ends at step 280 with shipment of the refurbished information handling system. If the information handling system is set for recycling at step 292, the process continues to step 294 to determine if the battery health is greater than a threshold and, if not, to step 296 to recycle the battery. If the battery is greater than the threshold, the process continues to step 298 to refurbish the battery for use in another system, to step 300 to recycle the rest of the information handling system and ends at step 280.

Figure 20A:
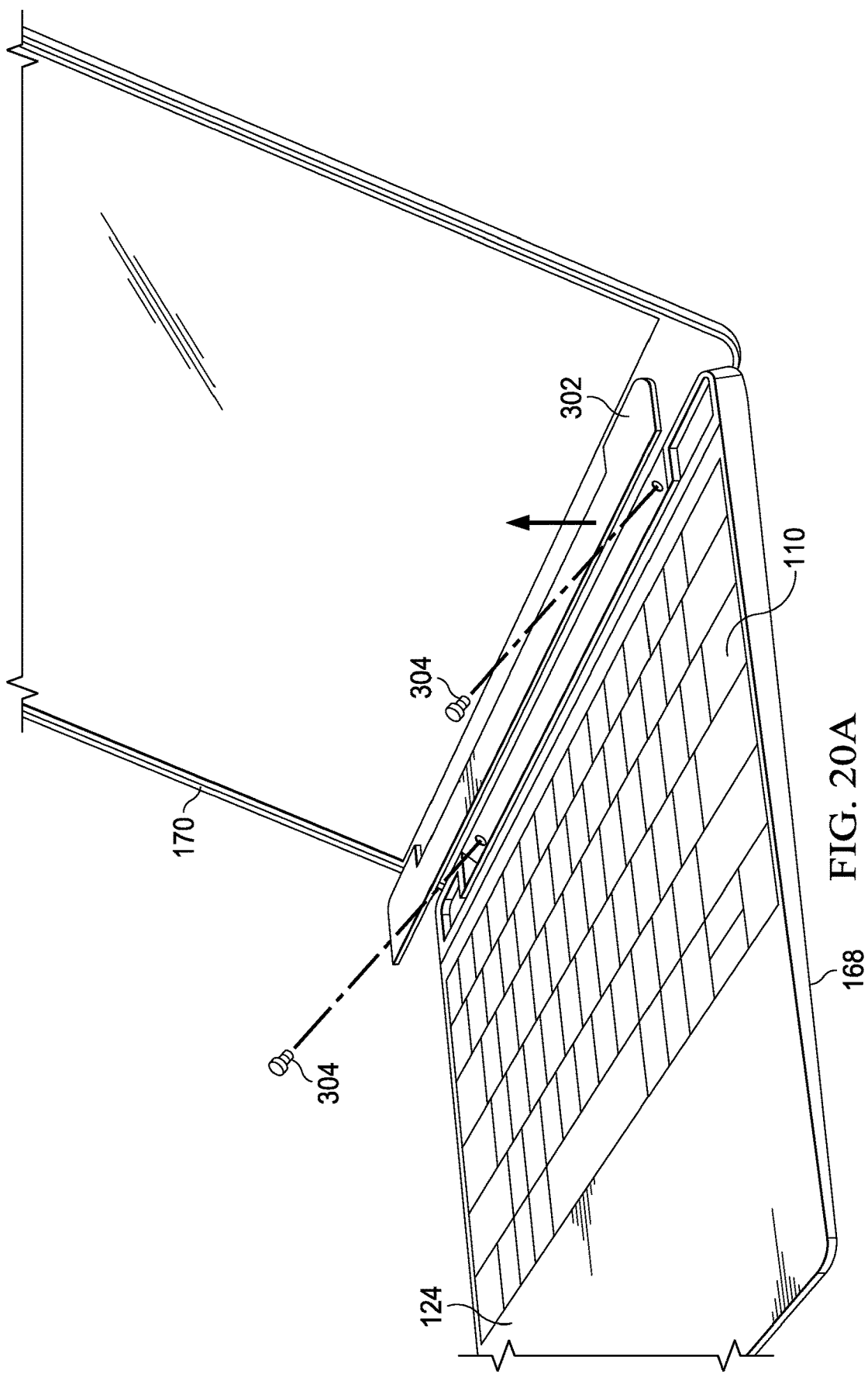
Figure 20C:
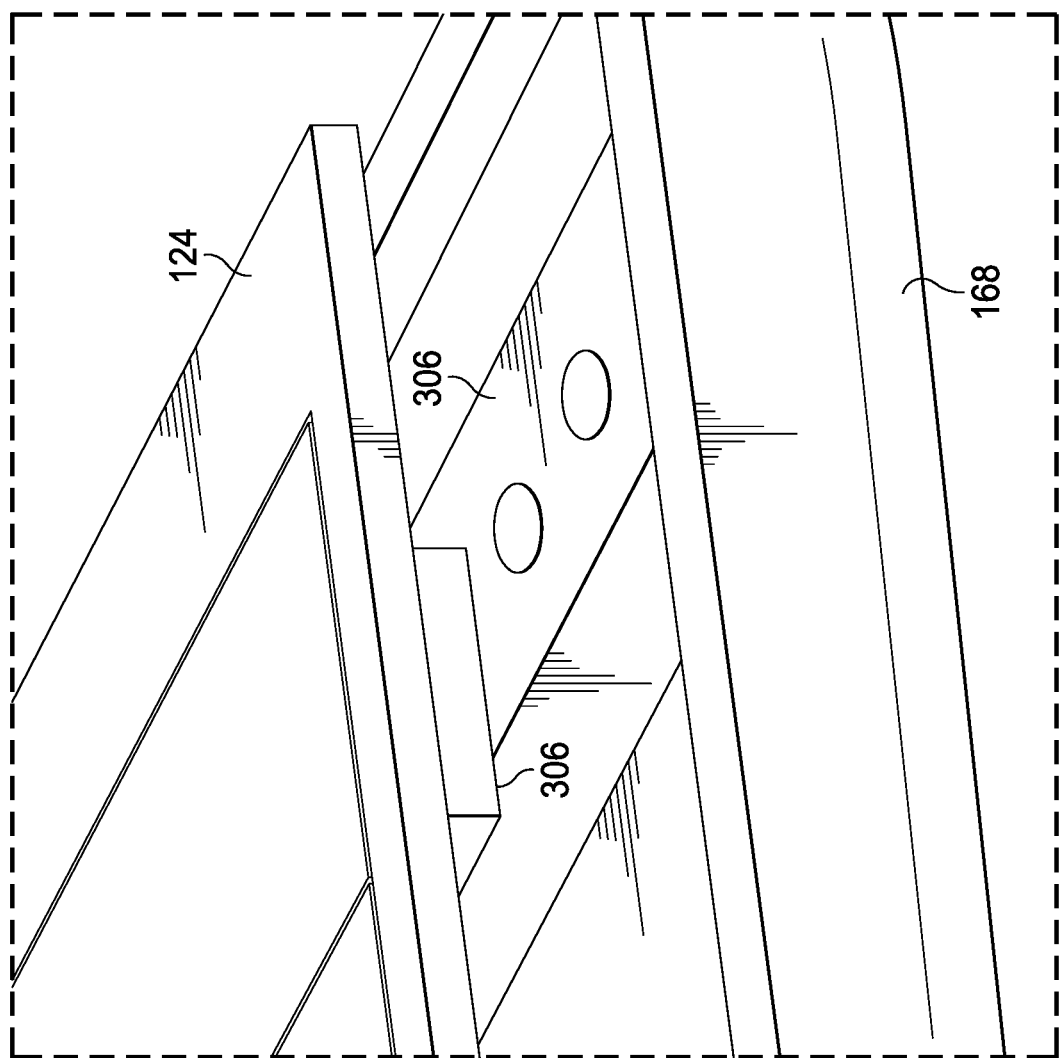
Figure 20D:
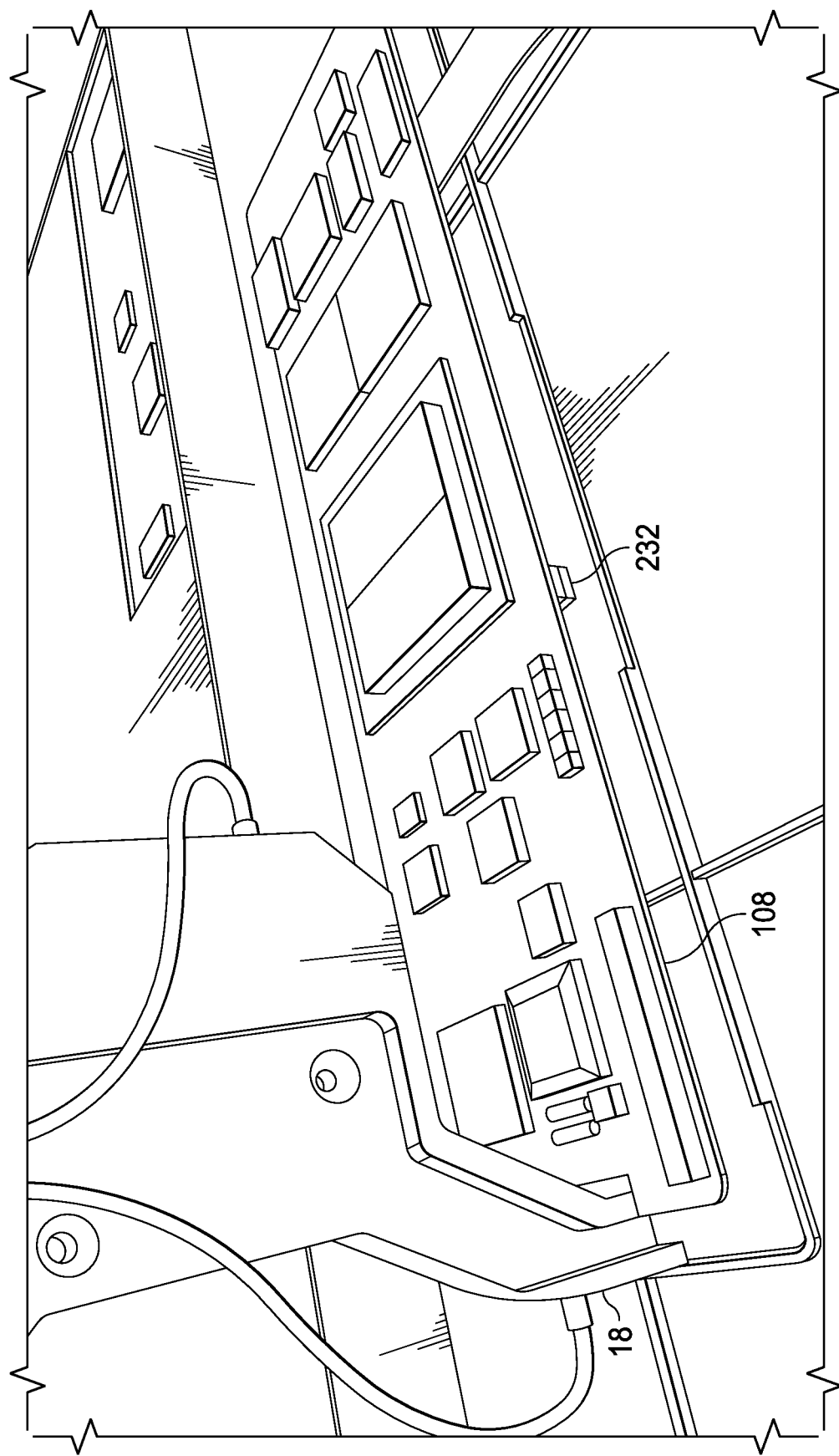

Referring now to FIGS. 20A, 20B, 20C and 20D, an example embodiment of an information handling system is depicted having an automated and tool-less housing cover removal. To promote efficient and automated information handling system reuse and refurbishment, a keystone element 302 couples and releases the housing as a composite assembly to allow for rapid and simple release of housing cover 124 from main housing portion 168. Housing cover 124 is secured to main housing portion 168 at specific pressure points spaced along the perimeter and internal framing of main housing portion that release at application of a defined force. The defined force is prevented when keystone element 302 is secured in place so that separation of the housing is prevented, yet readily accomplished after removal of keystone element 302. A standard sized keystone element 302 that fits to housings of different dimensions provides standardized interactions for automated manipulation of the housing at manufacture and disassembly. FIG. 20A depicts keystone element 302 released by removal of screws 304 and lifted from housing cover 124 to release housing cover 124 in response to a predetermined application of force. Screws 304 may have a level of security provided by a particular screw type that prevents removal unless a special tool is applied or may have a completely tool-less removal. FIG. 20B illustrates that a sliding and lifting force applied to housing cover 124 extracts the housing cover as a unit to include the keyboard. FIG. 20C illustrates an example of a coupling arrangement that couples housing cover 124 to main housing portion 168 against a predetermined pressure. Opposing couplers 306 on housing cover 124 and the inner housing perimeter of main housing portion 168 slide under each other to hold housing cover 124 in place. In the example, a slight slide and lift separates housing cover 124 from main housing portion 168. In an alternative embodiment, other types of couplers may be used, such as snaps, that release in response to a predetermined separation pressure. FIG. 20D depicts a perspective view of main housing cover 168 with a robotic arm 18 configured to grasp a secondary board 108 and release the secondary board from snap connectors 232 that couple it to main housing portion 168.

Figure 21A:
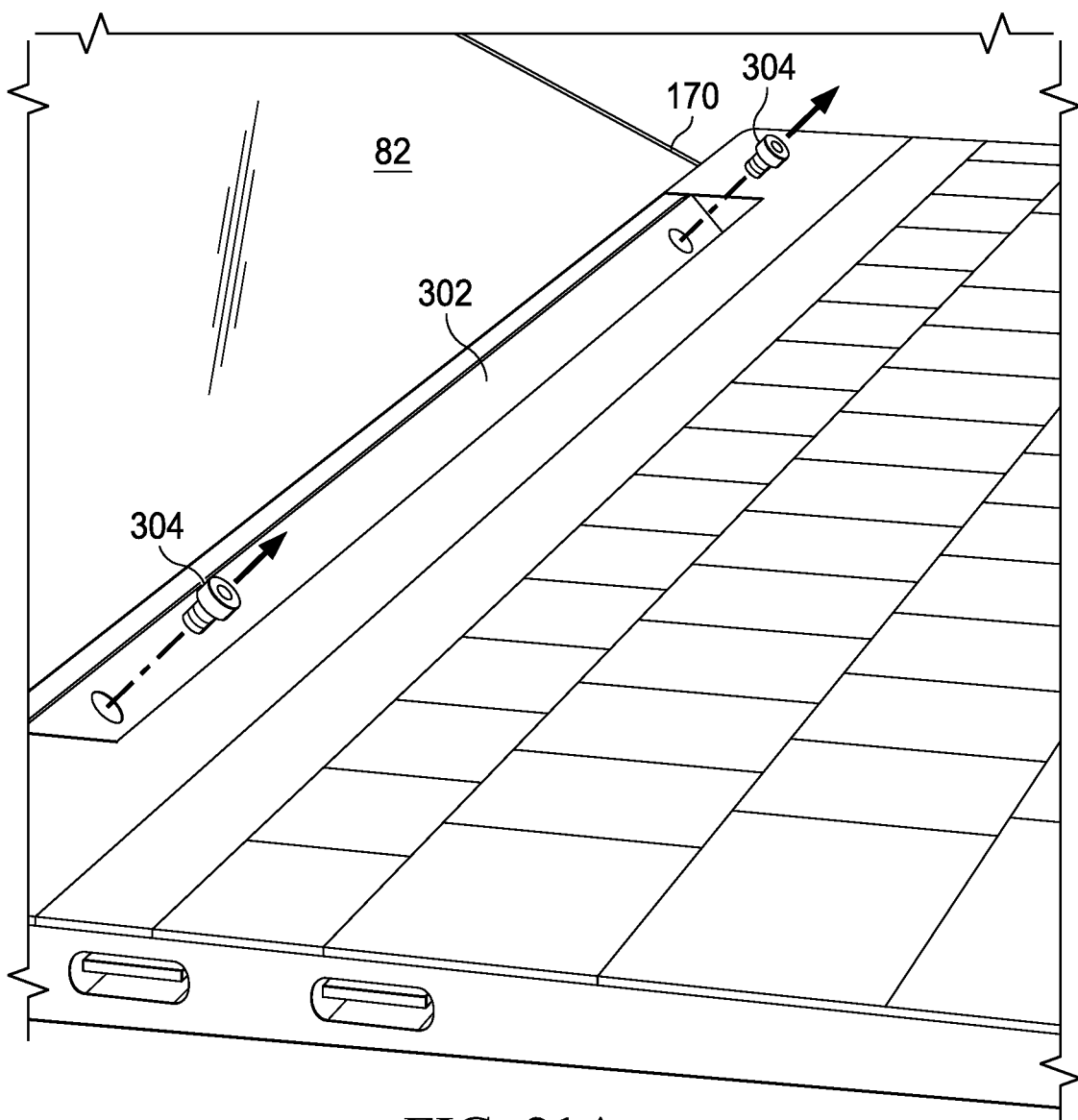
FIGS. 21A, 21B and 21C depict an example embodiment of an information handling system having an automated and tool-less display removal.
Figure 21B:
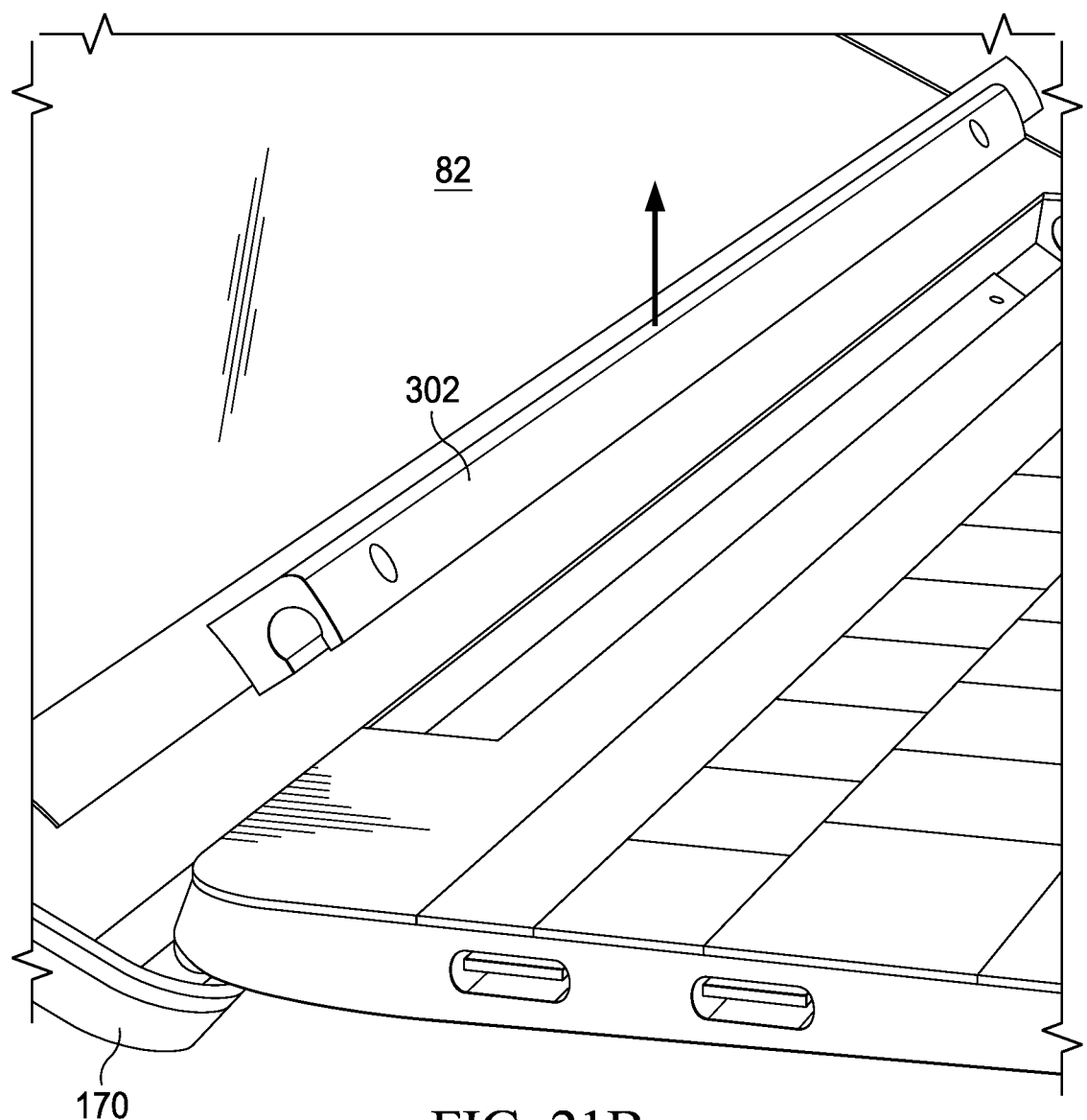
Figure 21C:
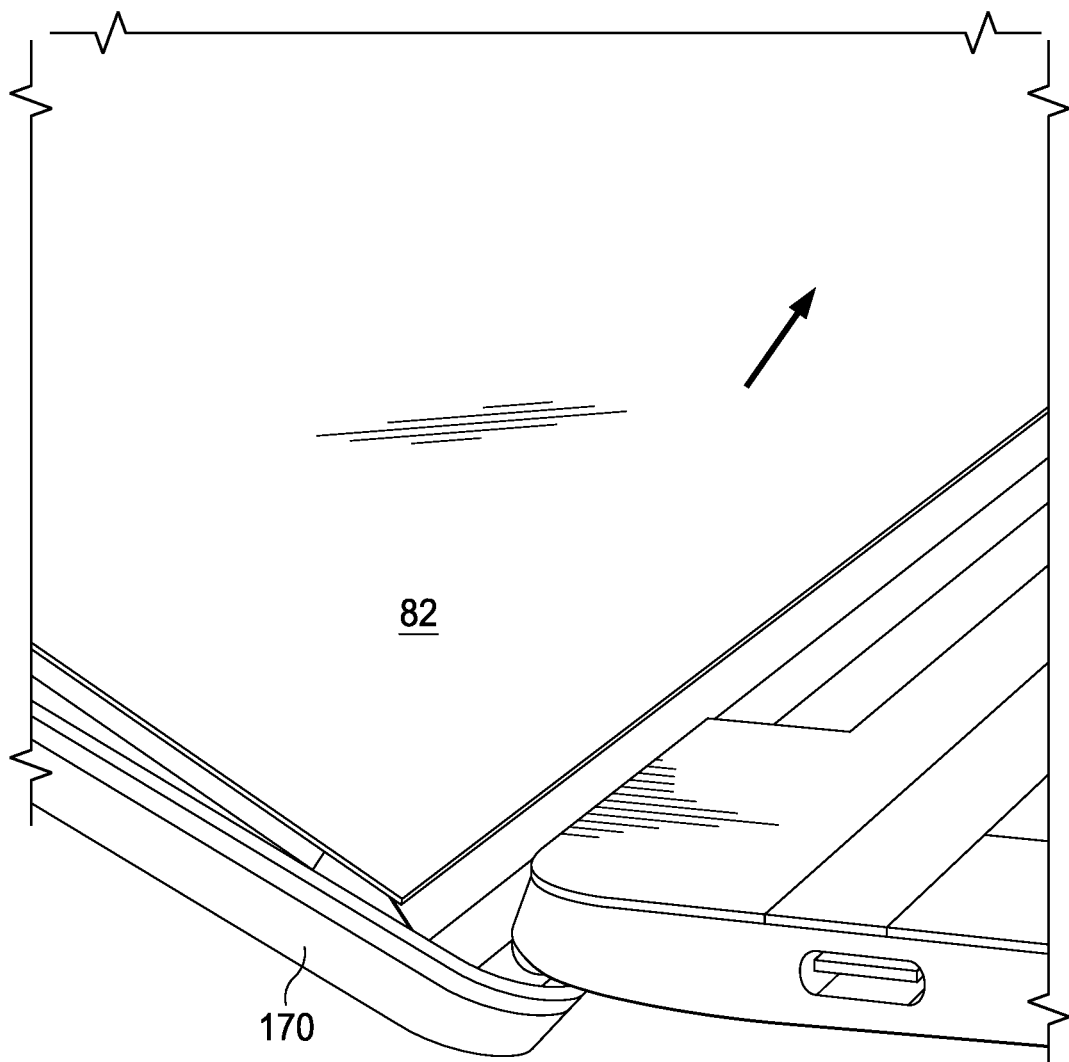

Referring now to FIGS. 21A, 21B and 21C, an example embodiment of an information handling system is depicted having an automated and tool-less display removal. Keystone element 302 operates in a similar fashion to the operation of the housing cover, providing a simple release of the display 82 to reuse, refurbish or recycle components of the information handling system. FIG. 21A depicts screws 304 removed from keystone element 302 so that removal of keystone element 302 releases display 82 from lid housing portion 170, as depicted by FIGS. 21B and 21C. In the example embodiment, couplers similar to those of the housing cover couple display 82 to lid housing portion 170 and release responsive to pressure applied to separate display 82 from lid housing portion 170. Although the example embodiment shows keystone element 302 having a different shape than that used in the housing cover, in one alternative embodiment a common shaped keystone element may be used. Further, a common keystone element may fit on displays of different dimensions with the opposing couplers of the display and lid housing portion holding the display in position and the keystone element preventing release by restricting display movement when the keystone element is coupled in place.

Figure 22:
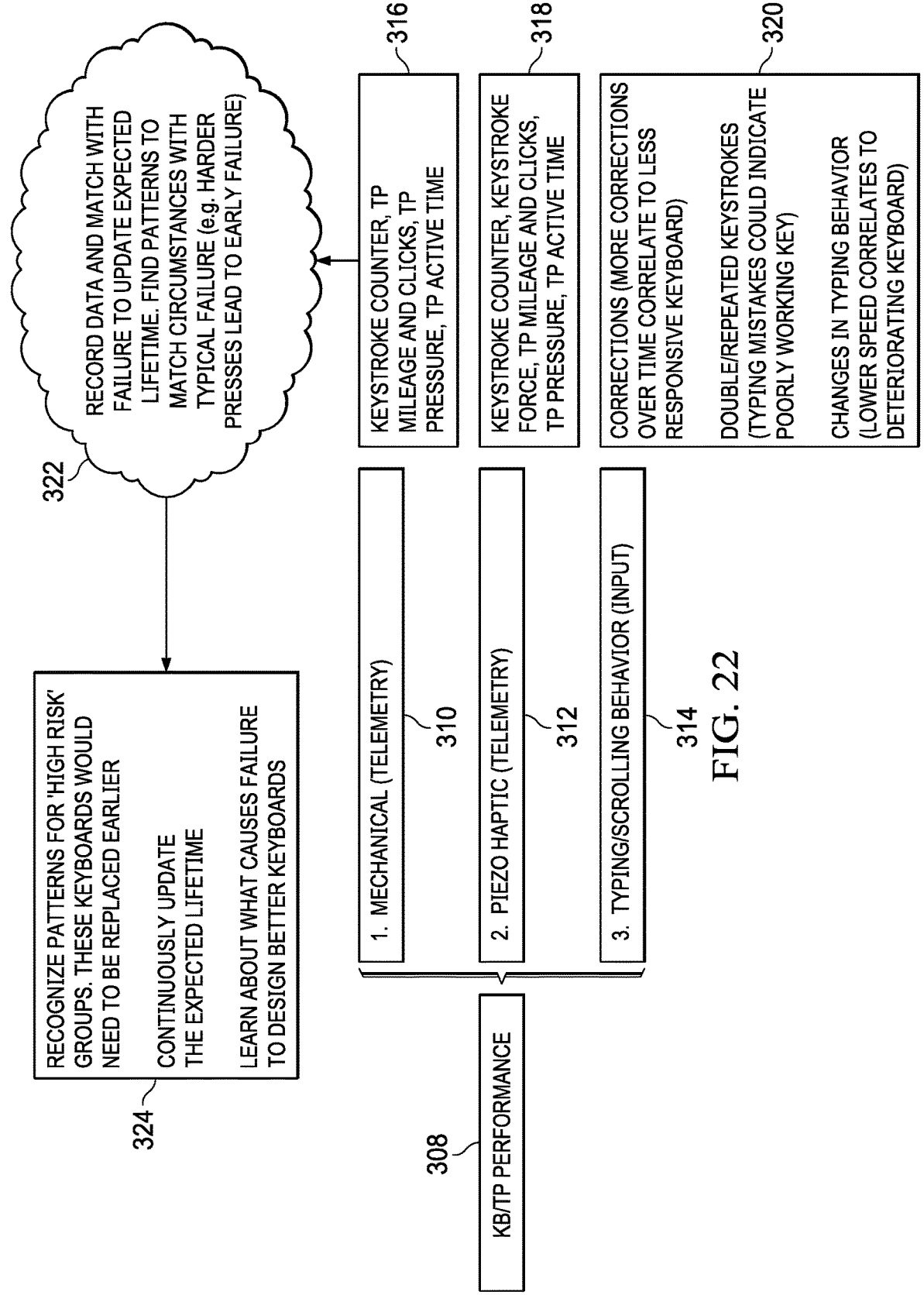
FIG. 22 depicts a flow diagram of a process for use of keyboard and touchpad metrics to automate housing cover disposition.

Referring now to FIG. 22, a flow diagram depicts a process for use of keyboard and touchpad metrics to automate housing cover disposition. At step 308 an end user performs inputs at the keyboard and touchpad in operational conditions. In some instances, these inputs can indicate failures of particular key or touchpad inputs, such as where an input error is repeatedly detected with an identified input. At step 310 mechanical inputs are tracked and counted, such as by key contact against a key membrane. At step 312, some input devices use touch detection with an output indicated by haptic feedback, such as with a piezoelectric vibration. In such situations, actuation of the piezo haptic feedback indicates that input is made. At step 314 inputs are also tracked based upon typing and scrolling behavior detected at the information handling system, such as inputs to a word processing application. Typed inputs are a convenient way of counting inputs at the keyboard, but also over a comparison of an end user's input devices by indicating when inputs are made through a peripheral rather than an integrated keyboard. This information provides an indication of the end user's reliance on integrated versus peripheral input devices to help direct a replacement system to the end user with an appropriate remaining lifespan.

At step 316 mechanical inputs are tracked by a keystroke counter in the keyboard, a touch "mileage" and click counter that counts touch interactions and/or a touchpad active time, such as power applied at the touchpad with the system on and housing in an open position. At step 318 piezo haptic inputs are tracked with a keystroke counter, keystroke force, touchpad mileage and clicks, touchpad pressure and/or touchpad active time. At step 320 typing and scrolling behavior is analyzed with logic running on the system CPU that tracks corrections made to inputs, double or repeated keystrokes and changes in typing behavior, such as slower typing rates that indicate reduced trust in the accuracy of the keyboard over time. As keyboard and touchpad data is tracked and recorded in local memory, it is also communicated at step 322 to a network or cloud location for analysis, such as with artificial intelligence tuned to predict keyboard failures. For instance, keyboard and touchpad input data is compared against historical data to track the expected life remaining for each keyboard and touchpad, such as with pattern matching. For instance, a match between harder press pressure and earlier failure would allow preemptive shipment of a replacement system to a subscriber before keyboard reliability detracts from the end user experience. At step 324 analysis is performed to identify risk groups of end users who may need earlier system or keyboard replacement. The expected life of the keyboard and touchpad is updated as conditions change and analysis is performed to associate cause and effect regarding keyboard failures to provide improved designs. In addition, where keyboard and touchpad expected life remains high versus other components that result in a return of the system, the keyboard and touchpad may be identified to use in a refurbished system.

Figure 23:
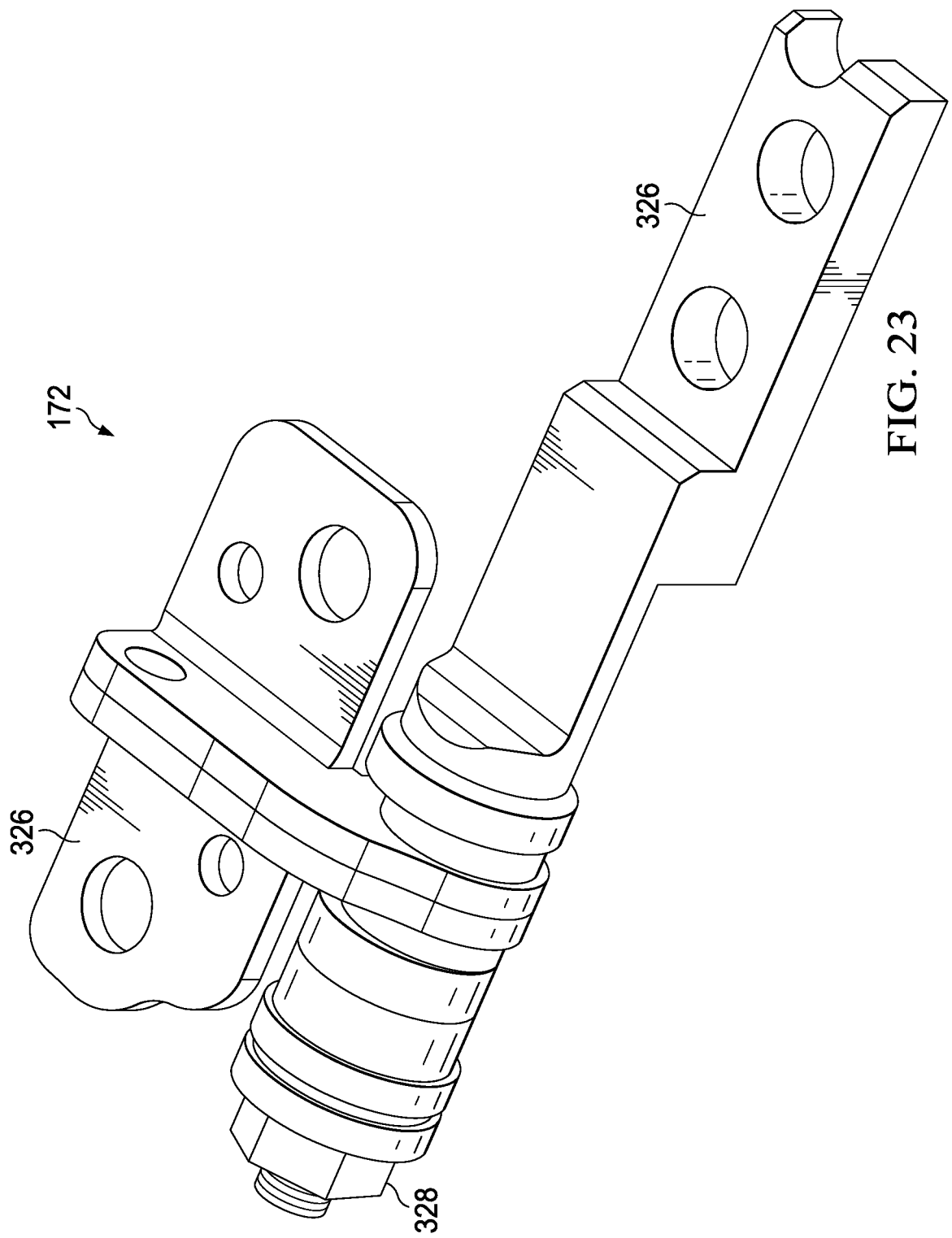
FIG. 23 depicts a perspective view of an example hinge having a torque engine.
Figure 24:
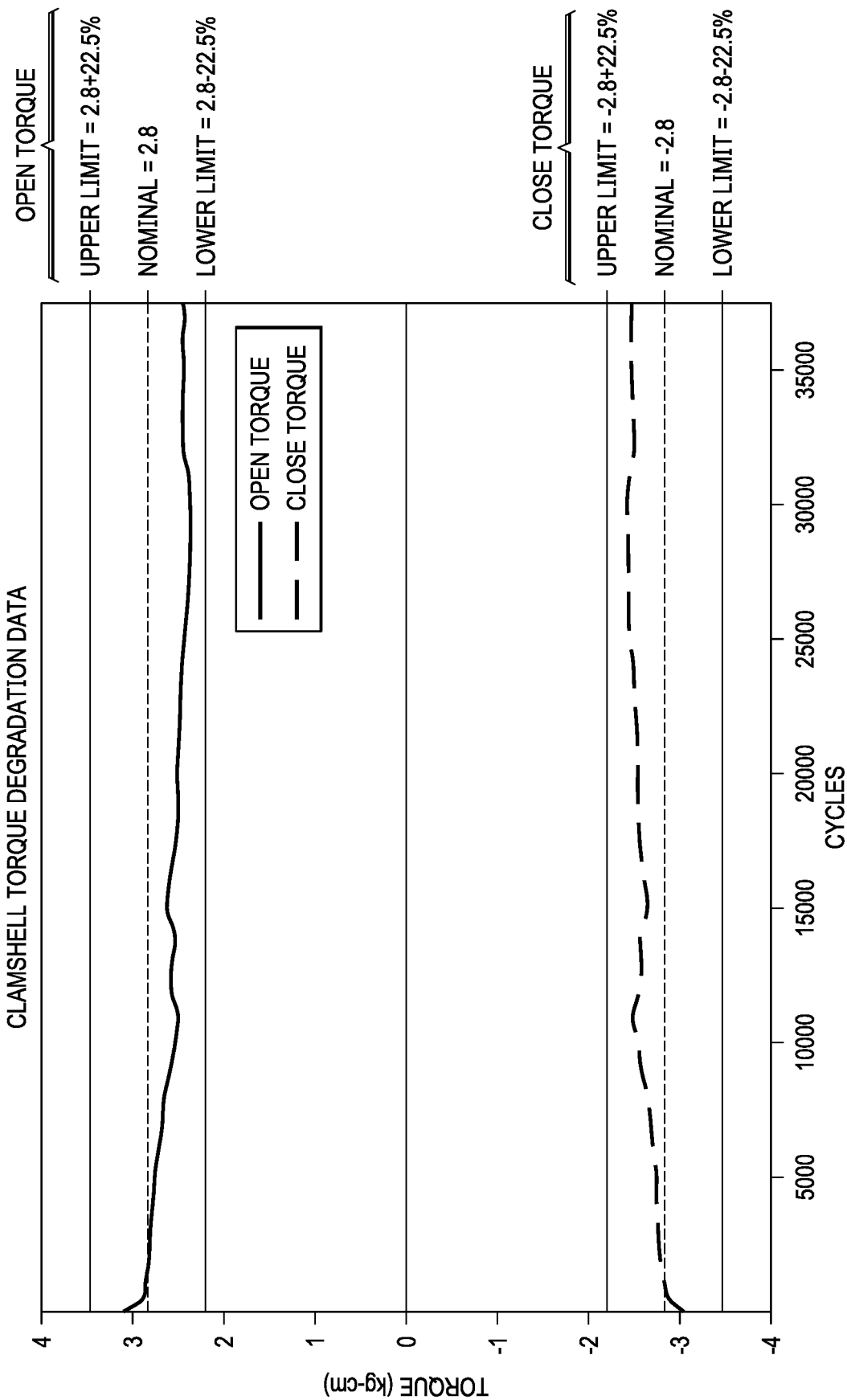
FIG. 24 depicts an example of torque generation associated with the example hinge.

Referring now to FIG. 23, a perspective view depicts an example hinge 172 having a torque engine 328. Hinge 172 couples to opposing housing portions of an information handing system housing with brackets 326 and regulates housing portion rotational orientation with torque engine 328. For example, torque engine 328 generates friction that resists rotation so that the housing portions remain in a set rotational orientation unless a sufficient force is applied to overcome the friction. In the example embodiment, friction is generated by tightening a nut at an end of the hinge axle to compress friction washers, such as Bellville washers. During initial manufacture, hinge 172 is typically tuned to have a defined torque response that tends to decrease as the hinge is used in the field. FIG. 24 depicts an example graph of torque generation associated with the example hinge and the change in torque that results over time as friction wears the torque engine with open and close cycles. Hinge 172 may have a wide variance of wear over a lifetime of an information handling system based on the end user usage patterns. For instance, an end user who travels often with a portable information handling system may activate the hinge often, resulting in substantial wear, as compared with an end user who typically uses the portable system in a dock in a closed position. Although the example embodiment depicts a single axis hinge, in alternative embodiments dual axis synchronized and sequential hinges may be used.

Figure 25:
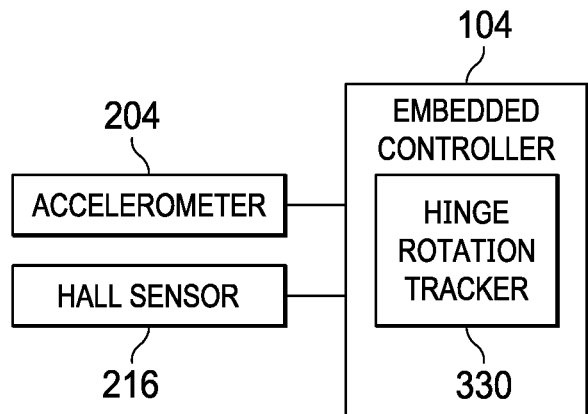
FIG. 25 depicts a block diagram of a system for tracking hinge use at an information handling system.

Referring now to FIG. 25, a block diagram depicts a system for tracking hinge use at an information handling system. In the example embodiment, an accelerometers 204 detect accelerations at the information handling system at both housing portions so that rotation of the housing portions relative to each other is determined. As an example, accelerometers 204 are configured as gyroscopes that detect changes in the relative rotational orientation of the housing portions to determine movement between closed and open positions. Hall sensors 216 disposed in one or both housing portions detect magnets in the other housing portion to determine closed and open positions. In alternative embodiments, other sensors may be used that track hinge movement, such as an analog hinge rotation tracker 330 coupled to the hinge or an e-compass AGM sensor. Embedded controller 104 executes a hinge rotation tracker retrieved from non-transitory memory to monitor the accelerometers and hall sensors for tracking housing portion rotation over time to track hinge wear. The hinge rotation data is saved locally and sent to the cloud so that the information handling system may be replaced before hinge wear results in reduced end user satisfaction.

In one example embodiment, an e-compass AGM sensor in each housing portion tracks both housing rotational orientation and rotational speed to estimate hinge wear. With rotation movement and speed empirical data, an estimate is performed to determine when a hinge will have torque fall outside of limits to initiate recycling or refurbishment of the hinge. As an example, a hinge may restore torque by calibration of compression of a nut against a friction washer, however the refurbishment will tend to have a shorter lifespan than the initial calibration before friction wears the washers. Tracking hinge use after refurbishment provides estimates of hinge life adjusted for the previous wear. For example, cloud data of previous hinge use is saved to a refurbished system having the refurbished hinge so that both local and network storage reflects the hinge use. Empirical data modeled by artificial intelligence provides predictions of hinge life remaining and scheduling of system replacement before hinge performance impacts an end user. Further, end user usage patterns can adjust how refurbished hinges are allocated to information handling systems so that frequent hinge users get a hinge with a greater life remaining and less frequent hinge users, such as users who rely on docks, get hinges with less life remaining. In situations where multiple separate hinges are used in an information handling system, predicted hinge life may also be used to match hinges for use in a system so that all hinges in the system have a similar hinge life remaining.

Figure 26:
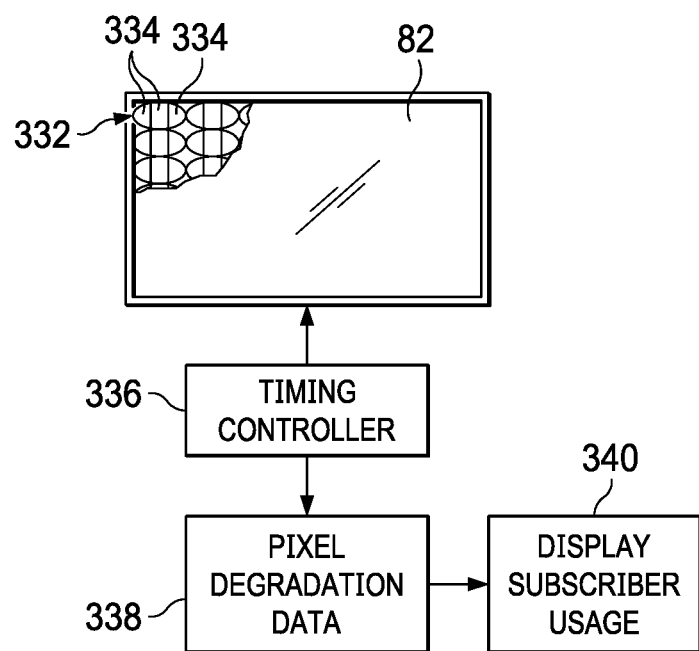
FIG. 26 depicts a block diagram of a system for tracking OLED display metrics to automate display disposition.
Figure 27A:
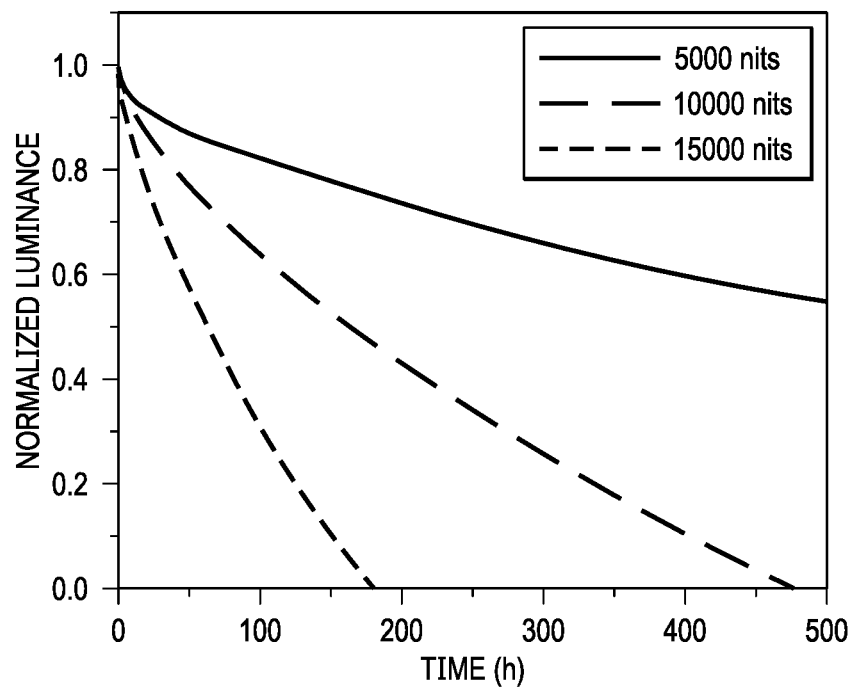
FIGS. 27A and 27B depict a graph that illustrates OLED display metrics tracked over time.
Figure 27B:
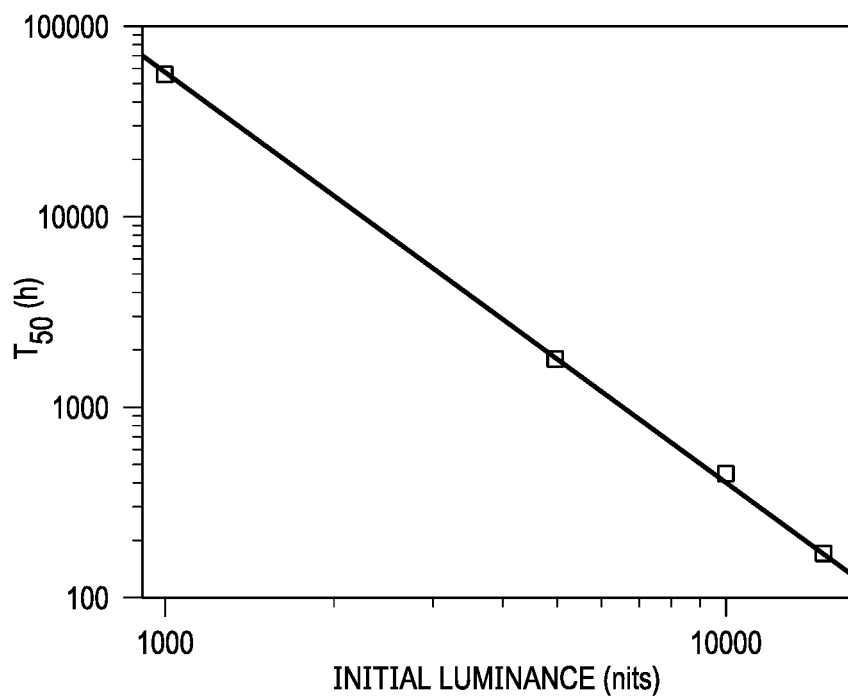

Referring now to FIG. 26, a block diagram depicts a system for tracking OLED display metrics to automate display disposition. In the example embodiment, display 82 presents visual images with organic light emitting diode (OLED) pixels 332 having red, green and blue OLED material 334. A timing controller 336 provides current to each pixel with a scan repeated over time so that the OLED material is excited to illuminate a desired amount of light. The organic material 334 tends to deteriorate as current is applied so that over time the amount of current applied for a given level of illumination tends to increase, which results in even more rapid OLED material deterioration. Timing controller 336 provides the pixel illumination information to a pixel degradation data storage so that as the OLED material degradation takes places the current applied to the pixels is adjusted to maintain a balanced color output at each pixel. For instance, as shown by the graphes of FIGS. 27A and 27B, different colored material tends to degrade at different rates with blue material in particular tending to degrade more rapidly. When OLED material degradation exceeds a threshold, such as a defined image quality and/or power use for a given brightness, replacement is typically called for. Pixel degradation data storage 338 is shared with a display subscription usage data base 340, such as in the cloud, to determine when a replacement is needed so that the end use experience is not impacted. The pixel degradation data can include brightness level over time, static imagery over time, blue light presentation time, temperature exposure and variation across the display, etc., In addition, display use itself is tracked versus presentation of visual images at a peripheral display or use of dock that allows the information handling system to operate with the housing closed and integrated display off. As is describe above, an subscriber usage pattern is applied so that the remaining life of a display based on degradation data allocates a refurbished display to an end user whose anticipated use matches the remaining display life.

Figure 28A:
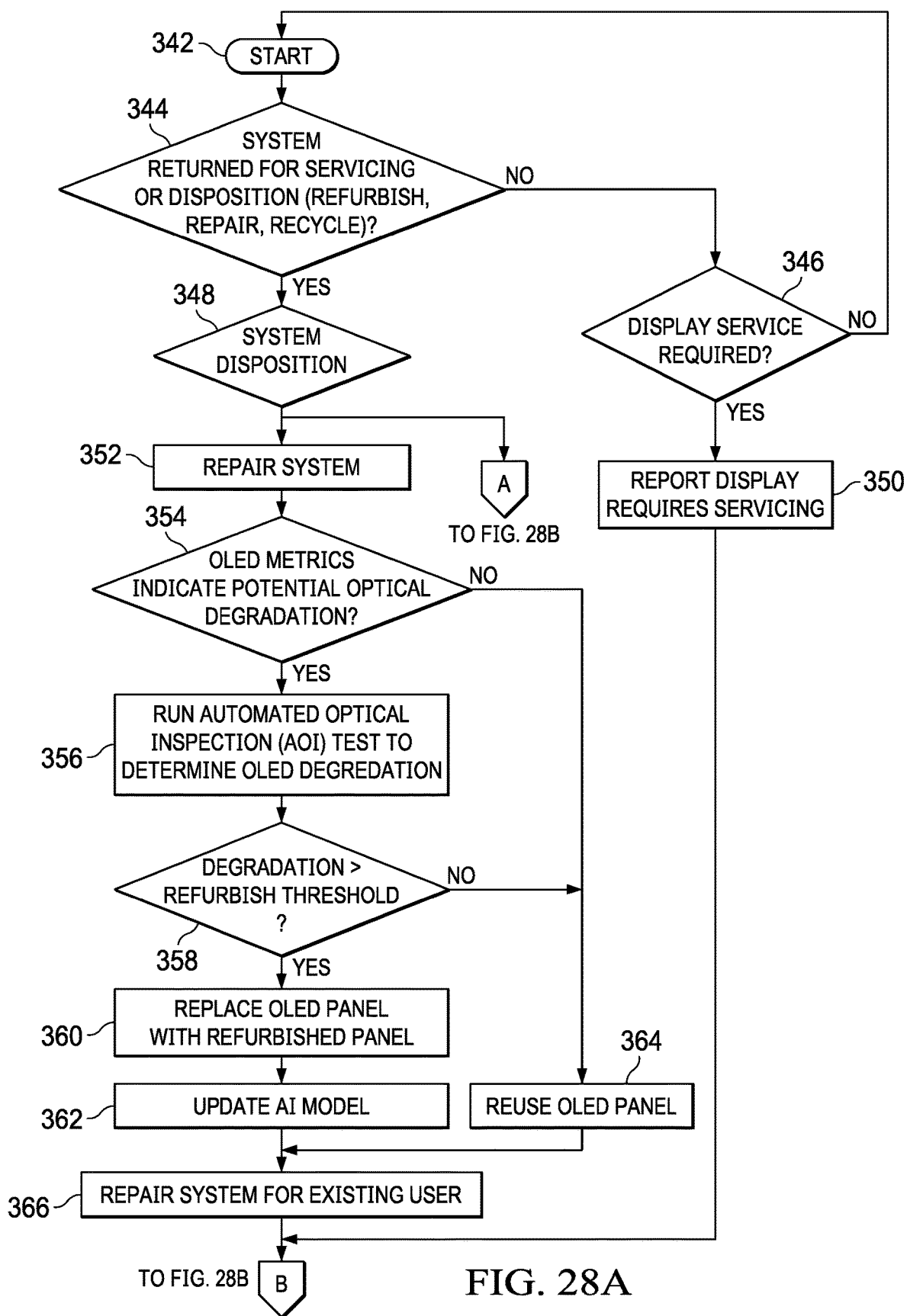
FIGS. 28A and 28B depict a flow diagram that tracks OLED display metrics to automate display disposition.
Figure 28B:
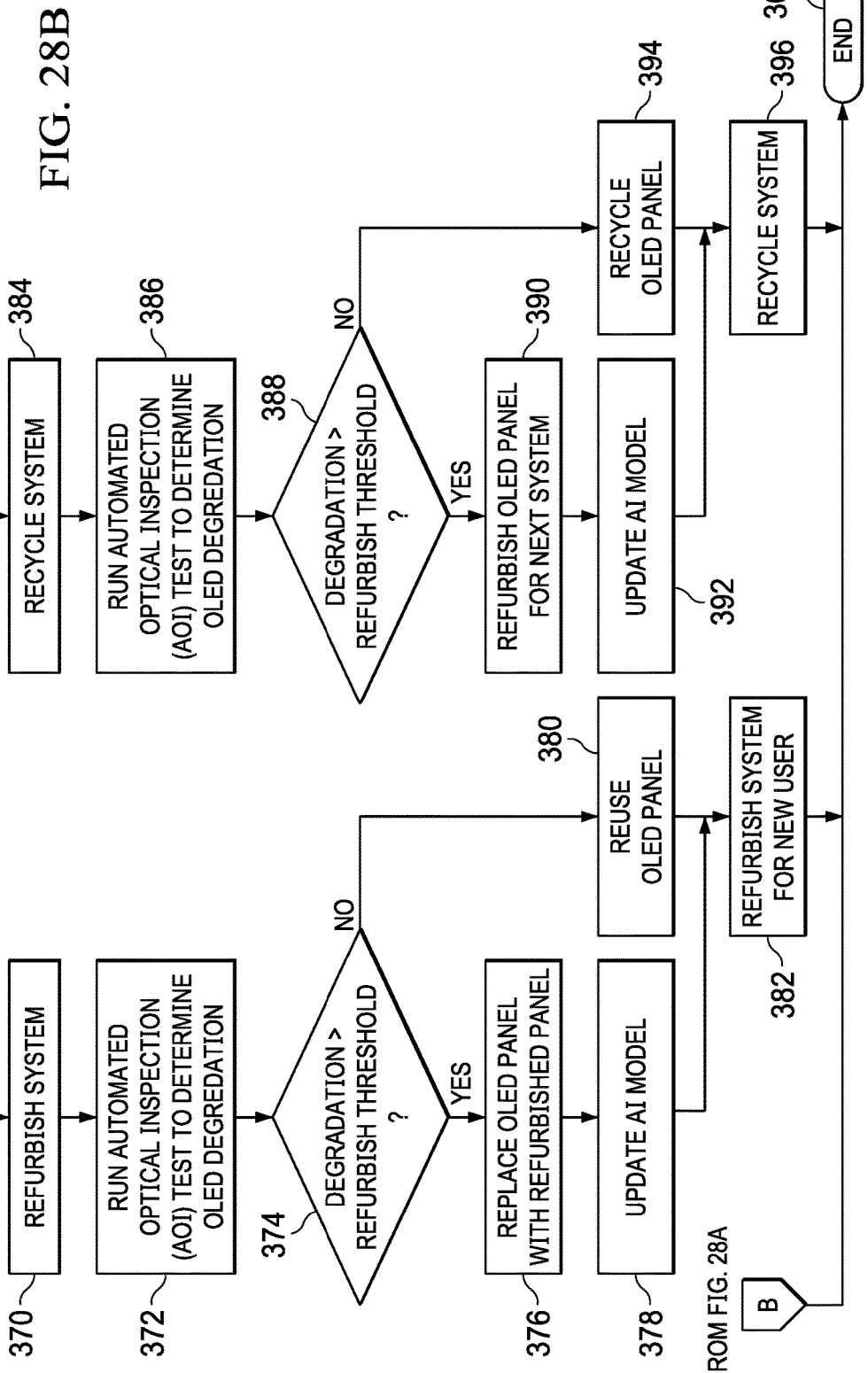

Referring now to FIGS. 28A and 28B, a flow diagram depicts a process that tracks OLED display metrics to automate display disposition. The process starts at step 342 and at step 344 determines if the information handling system is returned for servicing or disposition. If not the process continues to step 346 to determine if display service is required, such as based on remote display degradation data tracking. If not the process returns to step 342 to continue monitoring the display operational status. If display service is called for, the process continues to step 350 to report that display service is desired and a replacement system may be sent to the end user to have the system returned for refurbishment. In some instances, a display may be recalled to be used for refurbishment before too much of its useful life is gone, such as by placing the display in a system associated with an end user who uses a dock. Once the system recall is issued the process ends at step 368 to start again when the system arrives at a return center. If at step 348 the information handling system is returned, a disposition determination is made of whether to repair the system at step 352, refurbish the system at step 370 or recycle the system at step 384.

If a system repair is determined at step 352, the process continues to step 354 to determine if the OLED usage metrics stored on the system indicate excessive optical degradation. If not, the process continues to step 364 to reuse the OLED display panel and step 366 to repair the information handling system with the existing display. In an alternative embodiment, the information handling system may have a swap of the display to balance the remaining life based upon subscriber usage. If at step 354 excessive OLED degradation is detected, the process continues to step 356 to run an automated optical inspection test to determine the OLED degradation. The test may be performed with the OLED display installed in the information handling system or separated out and interfaced with the tester using the side connector described above. If at step 358 the degradation is less than a threshold, the process continues to step 364 to reuse the display. If the degradation exceeds the threshold, the process continues to step 360 to replace the OLED panel with a refurbished OLED panel. At step 362 the artificial intelligence model is updated with the test data and display replacement. The process continues to step 366 to repair the information handling system and ends at step 368.

At step 370 refurbishment of the information handling system is initiated by performing at step 372 the automated optical inspection test to determine the OLED display degradation. At step 374 a determination is made of whether the degradation exceeds a threshold and, if not, the process continues to step 380 to reuse the OLED display panel. If the OLED display degradation exceeds the threshold, the process continues to step 376 to replace the OLED display panel with a refurbished panel. At step 378 the artificial intelligence model is updated to reflect the test results and at step 382 the refurbished information handling system is sent to the end user and the process ends at step 382. At step 384 recycling of the information handling system is selected, such as if other components have exceeded refurbishment constraints, and the process continues to step 386 to run the automated optical inspection test to determine the OLED display panel degradation. If at step 388 the OLED display panel degradation exceeds a threshold, the process continues to step 394 to recycle the OLED display panel and to step 396 to recycle the information handling system. If the OLED display panel degradation does not exceed the threshold the process continues to step 390 to refurbish the OLED display panel for use in a different information handling system. At step 392 the artificial intelligence model is updated to reflect refurbishment, at step 396 the remainder of the information handling system is recycled and the process ends at step 368.

Figure 29A:
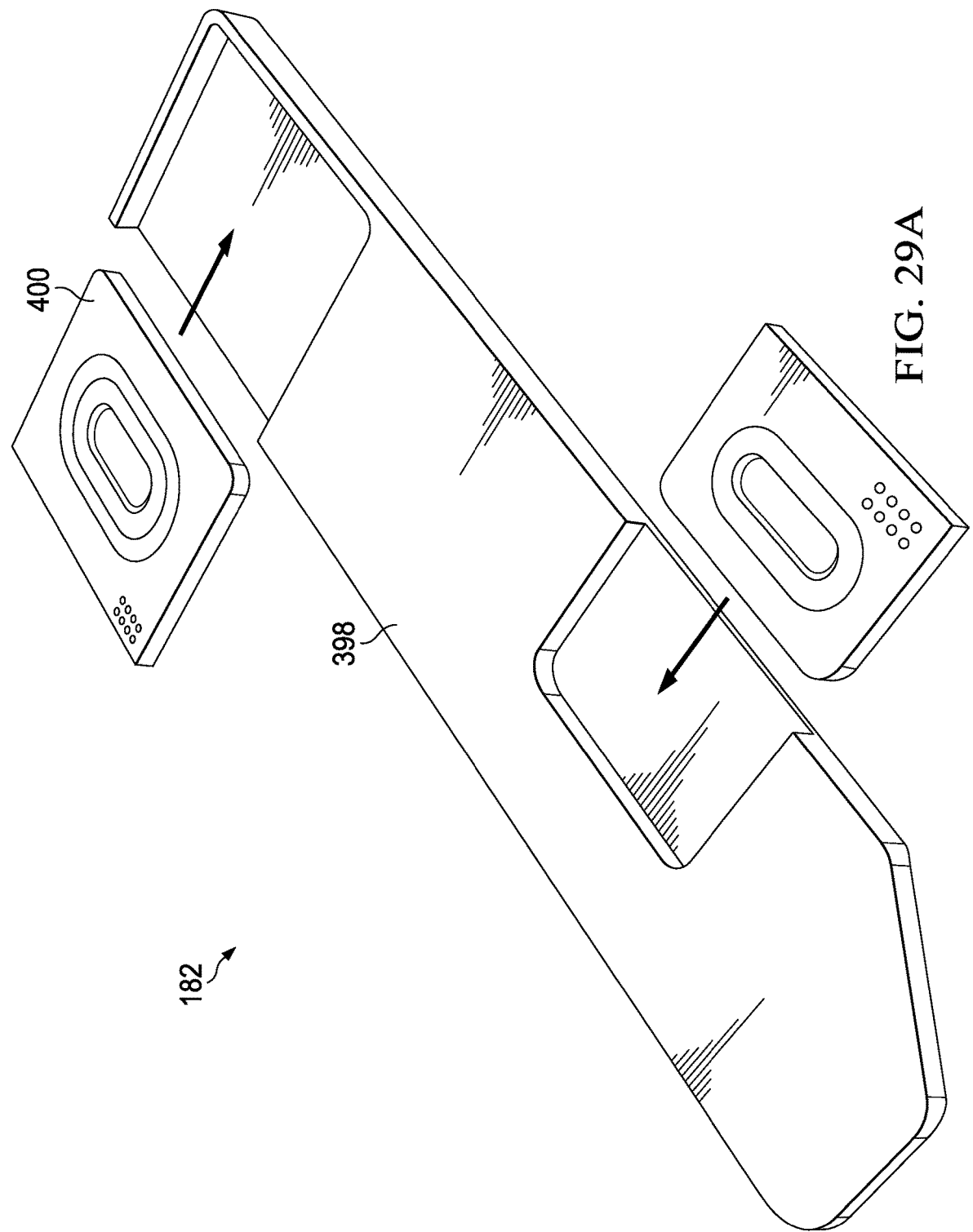
Figure 29B:
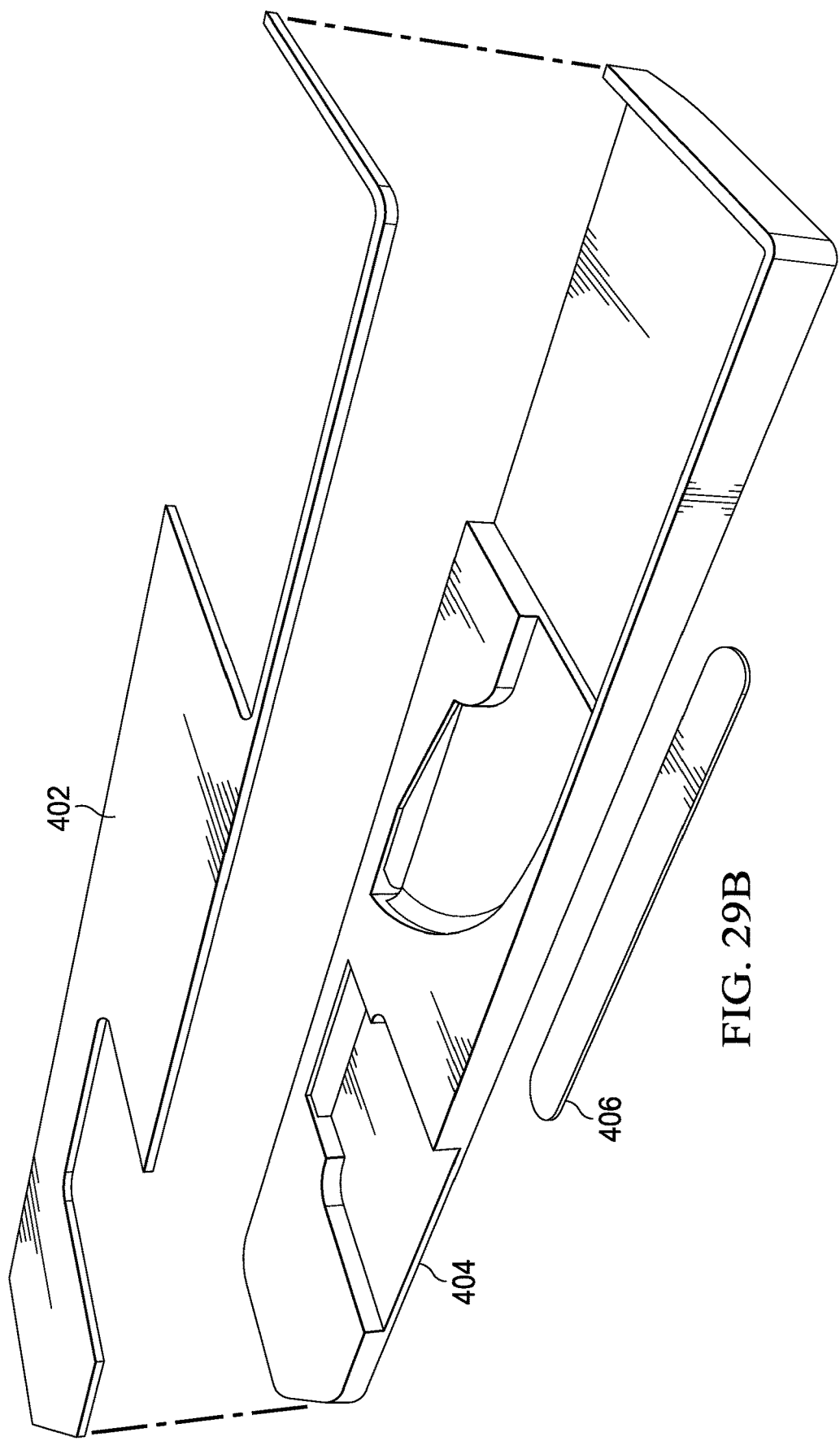

Referring now to FIGS. 29A, 29B and 29C, a speaker configuration is depicted for modular assembly in an information handling system. A speaker 182 generates audio sounds with vibrations created by application of an analog audio signal. For example, speaker 182 is a piezoelectric speaker that creates the audio sound by translating the vibrations to a speaker chamber 398 having desired acoustical characteristics. To provide a quality sound across different types of information handling system platforms, speaker chamber 398 has a standardize shape and configuration to provide acoustics with a desired chamber back volume. A speaker drive cartridge 400 has a self-sealing interface to define the acoustic chamber in a repeatable manner that helps to enable speaker reuse and refurbishment. FIG. 29A depicts speaker cartridge 400 holding a piezoelectric speaker 182 that fits into a slot defined in speaker chamber 398. FIG. 29B depicts an exploded view of the speaker chamber 398 defined by an upper portion 402 and a lower portion 404 with a gasket 406 disposed to seal the speaker chamber. FIG. 29C depicts gasket 406 disposed between upper portion 402 and lower portion 404 to seal the chamber with a wedge shape that biases apart to press against both sides of speaker chamber 398. Speaker cartridge 400 includes pogo pin contacts at an upper surface that biases against contact pads of a housing cover to interface speaker 182 with the secondary board to receive the audio signal information.

Separation of speaker cartridge 400 from speaker chamber 398 promotes more efficient reuse, refurbishment and recycling of information handling systems. As an initial matter, speaker cartridge 400 and speaker 182 isolates rare earth materials, such as magnets and gold plating, in a reusable module having a smaller size so that recycling is more efficient when needed. A standardized speaker cartridge 400 fits into speaker chambers of different dimensions that can be used across plural platforms of plural dimensions. For instance, a 15 inch information handling system shares the same speaker cartridge as a 17 inch information handling system while providing superior sound with a large acoustic chamber. At reuse or refurbishment, speaker cartridges may be taken from any sized-platform for use in a different-sized platform while acoustic quality is maintained by sealing speaker chamber 398 with a new seal that has minimal environmental impact.

Although the present invention has been described in detail, it should be understood that various changes, substitutions and alterations can be made hereto without departing from the spirit and scope of the invention as defined by the appended claims.

What is claimed is:

1. An information handling system comprising:
   a housing having first and second housing portions rotationally coupled by a hinge;
   a housing cover having a keyboard and sized to couple over the first housing portion;
   a display sized to couple over the second housing portion, the display having a backplane;
   a main board coupled to the second housing portion under the display, the main board having a central processing unit and memory that cooperate to process information and that interfaces with the display to present the information as visual images at the display;
   a secondary board coupled to the first housing portion under the housing cover and interfaced with the main board, the secondary board having an embedded controller to manage operating conditions in the housing; and
   a vapor chamber coupled to the display backplane and thermally interfaced with the central processing unit to transfer thermal energy from the central processing unit.

2. The information handling system of claim 1 wherein:
   the main board couples to the vapor chamber proximate a side of the second housing portion at the hinge; and
   the vapor chamber extends from the side of the second housing portion to proximate an opposing side and past a perimeter of the main board.

3. The information handling system of claim 1 wherein:
   the display comprises a liquid crystal display having a backlight and a display panel separated from the main board by the backplane; and
   insulation is disposed between the backplane and backlight.

4. The information handling system of claim 3 wherein the insulation comprises an air gap and a graphene sheet, the graphene sheet thermally interfaced with the second housing portion.

5. The information handling system of claim 1 wherein:
   the display comprises an organic light emitting diode film separated from the main board by the backplane; and
   insulation is disposed between the backplane and the organic light emitting diode film.

6. The information handling system of claim 1 wherein the vapor chamber integrates with the backplane as a contiguous metal structure.

7. The information handling system of claim 1 further comprising:
   a timing controller board coupled to the backplate and having a timing controller interfaced with a display panel of the display a timing controller connector interface disposed at one side; and
   a timing controller connector exposed at a side of the main board and coupled to the timing controller connector interface to communicate visual information from the main board to the display.

8. The information handling system of claim 1 further comprising:
   a thermal sensor disposed to detect the vapor chamber temperature; and
   non-transient memory interfaced with the embedded controller and storing instructions that when executed on the embedded processor adjust central processing unit operations based upon the vapor chamber temperature.

9. The information handling system of claim 1 further comprising:

a thermal sensor disposed to detect the vapor chamber temperature;
an air mover coupled in the second housing portion to move air in the second housing portion; and
non-transient memory interfaced with the embedded controller and storing instructions that when executed on the embedded processor adjust air mover operations based upon the vapor chamber temperature.

10. A method for managing a thermal state of an information handling system, the method comprising:
coupling a main board to a housing, the main board having a central processing unit and memory;
coupling a display to the housing over the main board;
dissipating thermal energy from the central processing unit to a vapor chamber coupled to the display;
assembling the display from display panel, a backlight and a backplate;
integrating the vapor chamber as a contiguous part of the backplate;
assembling the housing from first and second housing portions rotationally coupled by a hinge; and
coupling the main board to the backplate and vapor chamber at a side of the second housing proximate the hinge, the vapor chamber extending away from the hinge to an opposing side of the housing and past a perimeter of the main board.

11. The method of claim 10 further comprising:
dissipating the thermal energy from the backplate to the housing; and
insulating between backlight and the backplate.

12. The method of claim 10 further comprising:
coupling a secondary board to the first housing portion, the secondary board including an embedded controller;
sensing a temperature of the vapor chamber; and
managing temperatures associated with the second housing portion with instructions executed on the embedded controller and the sensed temperature.

13. The method of claim 10 further comprising:
coupling a timing controller board having a timing controller to the backplate between the main board and the hinge; and
interfacing the timing controller board and the main board with connectors disposed at opposing sides of the timing controller board and the main board.

14. The method of claim 10 further comprising:
cutting an opening in the backplate; and
fixing the vapor chamber in the opening.

15. A display comprising:
a display panel operable to present visual images;
a backplate of thermally conductive material behind the display panel;
a vapor chamber integrated in the backplate;
a thermal couple region defined in the vapor chamber to thermally interface against a main board having a perimeter and central processing unit in a first housing portion; and
thermally interfacing the vapor chamber with an embedded controller coupled to a secondary board in a second housing portion, the embedded controller managing thermal conditions in the housing.

16. The display of claim 15 further comprising:
wherein the vapor chamber extends beyond the main board perimeter.

17. The display of claim 15 further comprising insulation disposed between the display panel and the backplate.

18. The display of claim 17 wherein the insulation comprises a graphene sheet.

* * * * *